(12) United States Patent
Betsuda et al.

(10) Patent No.: US 8,816,381 B2
(45) Date of Patent: Aug. 26, 2014

(54) LIGHT-EMITTING DEVICE, METHOD OF MANUFACTURING LIGHT-EMITTING DEVICE, AND ILLUMINATION DEVICE

(75) Inventors: Nobuhiko Betsuda, Yokosuka (JP); Kozo Ogawa, Yokosuka (JP); Koyoshi Nishimura, Yokosuka (JP); Soichi Shibusawa, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 938 days.

(21) Appl. No.: 12/912,434

(22) Filed: Oct. 26, 2010

(65) Prior Publication Data
US 2011/0101384 A1   May 5, 2011

(30) Foreign Application Priority Data

Oct. 30, 2009 (JP) ................ 2009-249934
Feb. 12, 2010 (JP) ................ 2010-029541
Oct. 15, 2010 (JP) ................ 2010-232291

(51) Int. Cl.
*H01L 33/00* (2010.01)

(52) U.S. Cl.
USPC ........................ 257/99; 362/249.02

(58) Field of Classification Search
CPC ................................. H01L 25/0753
USPC ........................ 362/249.02, 249.04
See application file for complete search history.

(56) References Cited

U.S. PATENT DOCUMENTS

| 6,495,005 | B1 | 12/2002 | Colgan |
| 2002/0070382 | A1 | 6/2002 | Yamazaki |
| 2002/0079503 | A1 | 6/2002 | Yamazaki |
| 2003/0038037 | A1 | 2/2003 | Colgan |
| 2004/0080939 | A1 | 4/2004 | Braddell |
| 2005/0073840 | A1 | 4/2005 | Chou |
| 2005/0200301 | A1 | 9/2005 | Yamazaki |
| 2005/0263771 | A1 | 12/2005 | Yamazaki |
| 2006/0239002 | A1 | 10/2006 | Chou |
| 2007/0145401 | A1 | 6/2007 | Ikehara |
| 2008/0128739 | A1* | 6/2008 | Sanpei et al. ......... 257/99 |
| 2008/0254650 | A1 | 10/2008 | Kadotani |
| 2009/0146149 | A1 | 6/2009 | Yamazaki |

(Continued)

FOREIGN PATENT DOCUMENTS

| CN | 1359140 | 7/2002 |
| CN | 1521865 | 8/2004 |

(Continued)

OTHER PUBLICATIONS

Chinese Office Action issued in CN20100533674.X mailed Aug. 21, 2012.

(Continued)

*Primary Examiner* — Ha Tran T Nguyen
*Assistant Examiner* — Aaron Dehne
(74) *Attorney, Agent, or Firm* — DLA Piper LLP (US)

(57) ABSTRACT

According to one embodiment, a light-emitting device includes a substrate, a plurality of pads and a plurality of light-emitting elements. The pads has electric conductance, and are arranged on the substrate. A reflecting layer which is formed by electroplating is provided on a surface of each of the pads. The light-emitting elements are mounted on the pads. A depressed part is left on the substrate. The depressed part is formed on the substrate by removing a pattern on the substrate, by which the pads are electrically connected.

7 Claims, 24 Drawing Sheets

(56) References Cited

U.S. PATENT DOCUMENTS

2009/0321753 A1    12/2009    Yamazaki
2011/0038147 A1*   2/2011     Lin et al. .................. 362/235
2011/0315993 A1    12/2011    Yamazaki

FOREIGN PATENT DOCUMENTS

| | | |
|---|---|---|
| CN | 1605790 | 4/2005 |
| JP | 2009-54989 | 3/2009 |
| WO | WO 02/086972 | 10/2002 |
| WO | WO 2009/017117 | 2/2009 |

OTHER PUBLICATIONS

English Language Translation of Chinese Office Action issued in CN20100533674.X mailed Aug. 21, 2012.

English Language Abstract of WO 2009/017119 published Feb. 5, 2009.

English Language Abstract of CN 1605790 published on Apr. 13, 2005.

English Language Abstract of CN 1521865 published Aug. 18, 2004.

English Language Abstract of CN 1359140 published Jul. 17, 2002.

Extended European Search Report issued in EP 10189480.6 on Jun. 28, 2013.

Chinese Office Action issued in CN201010533674 mailed Jul. 11, 2013.

English Language Translation of Chinese Office Action issued in CN201010533674 mailed Jul. 11, 2013.

Yong-Qiang Chen, "Brief Analysis of Creepage Distance and Clearance in GB4943_2001 Standard", Daily Electonic Appliances, vol. 9, pp. 4-7, (2008).

English Language Abstract of Yong-Qiang Chen, "Brief Analysis of Creepage Distance and Clearance in GB4943_2001 Standard", Daily Electonic Appliances, vol. 9, pp. 4-7. (2008).

English Abstract of JP 2009-54989 published Mar. 12, 2009.

English Translation of JP 2009-54989 published Mar. 12, 2009.

* cited by examiner

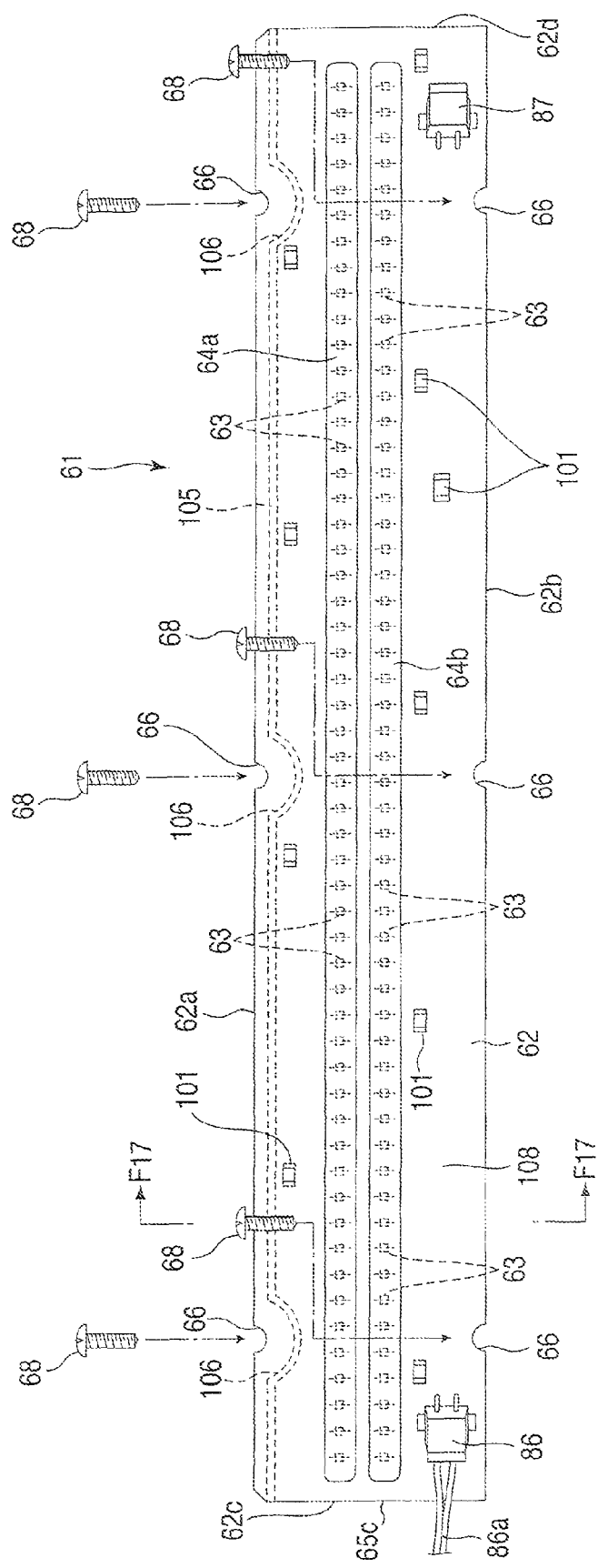
F I G. 12

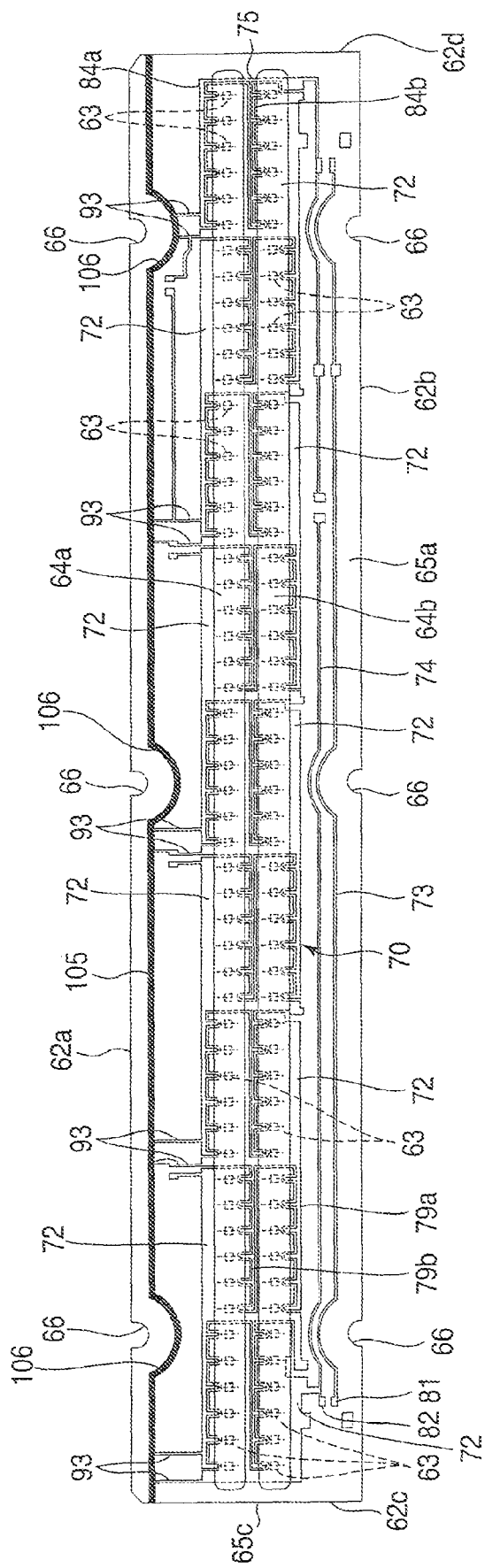
F I G. 15

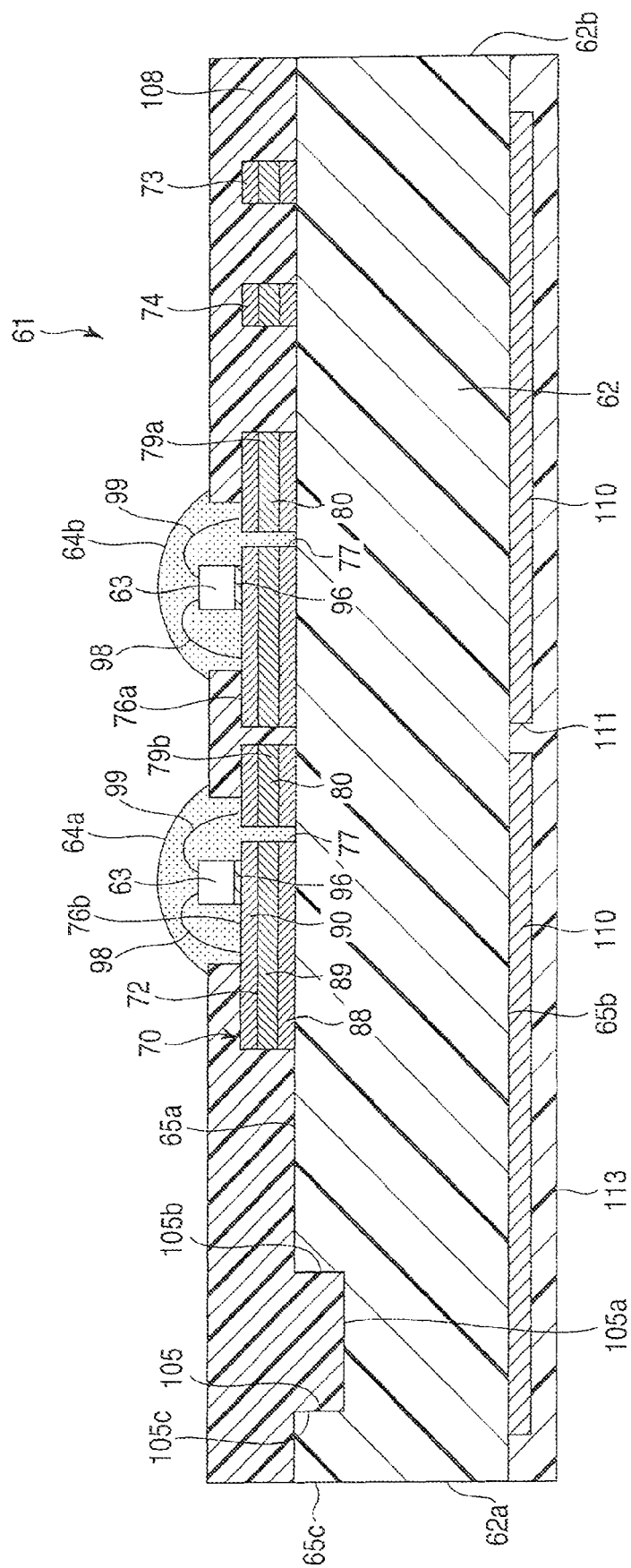
F I G. 17

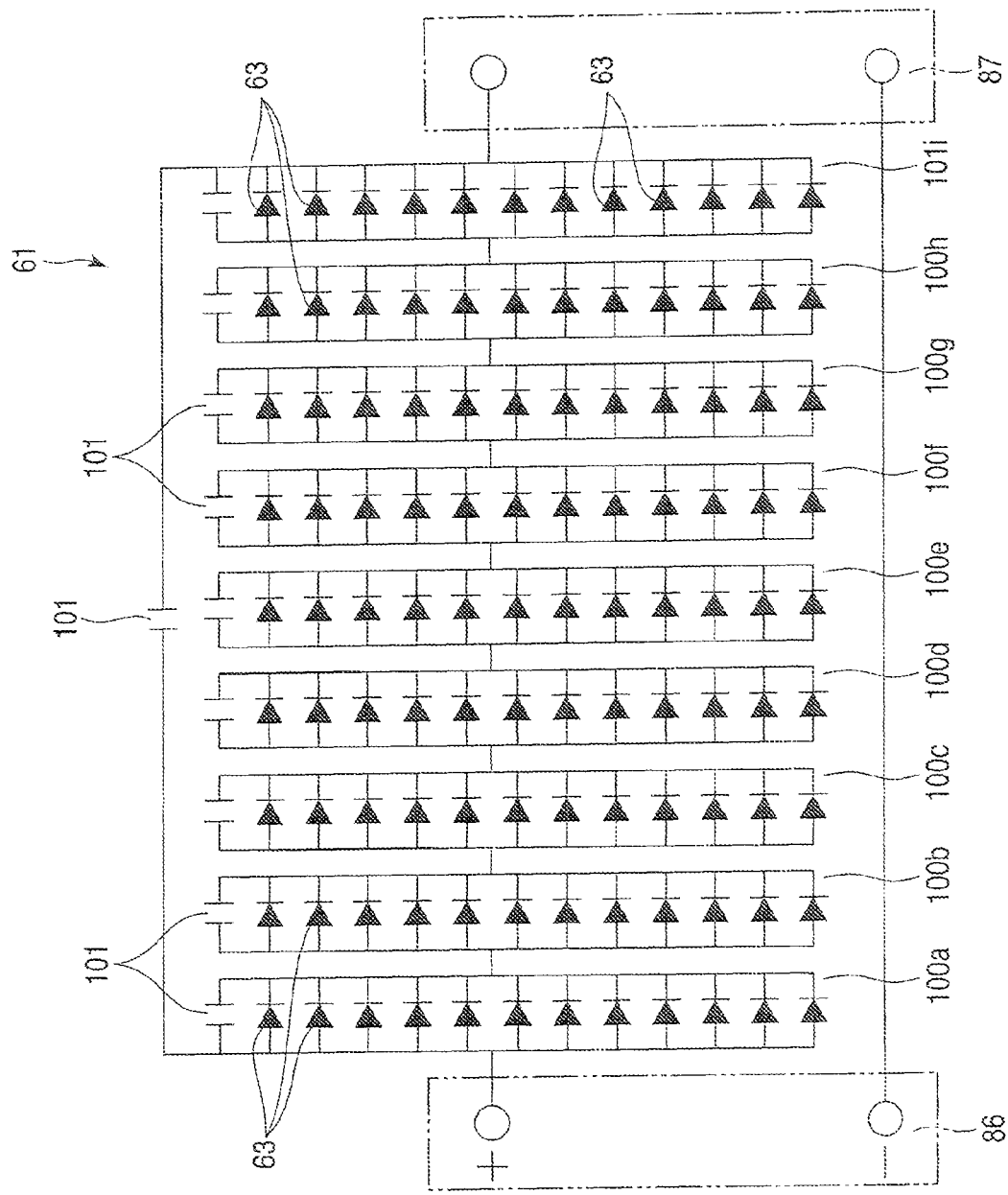
F I G. 18

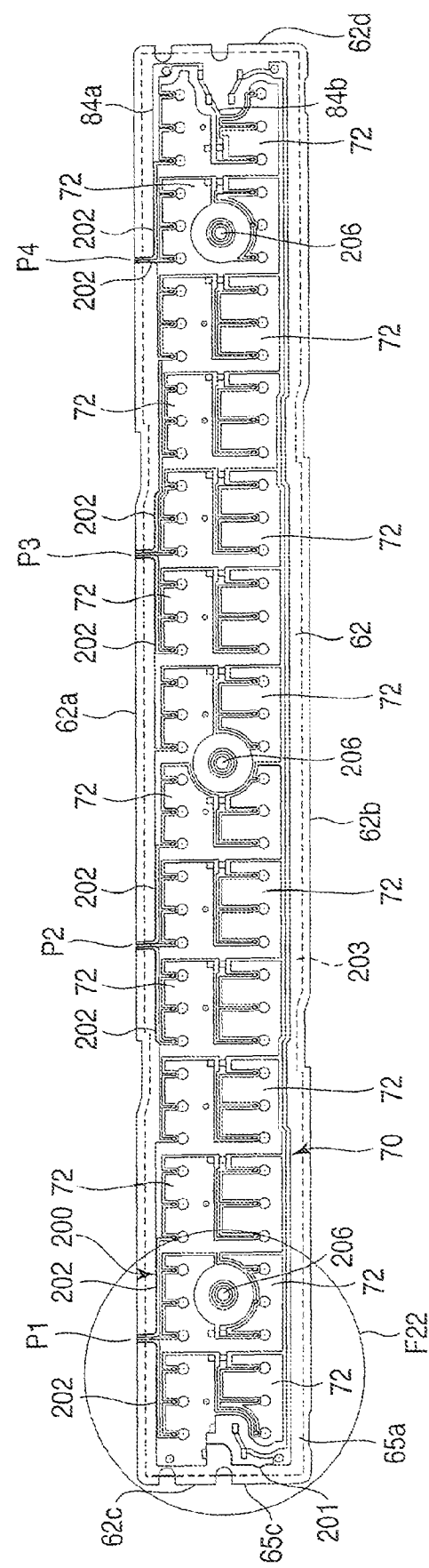
F I G. 20

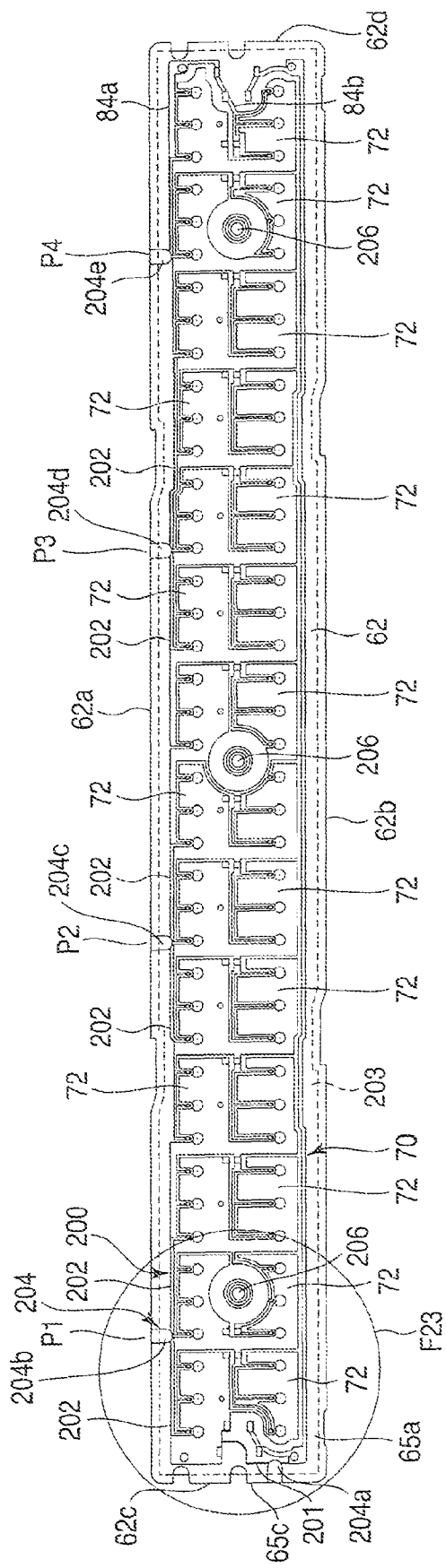
F I G. 21

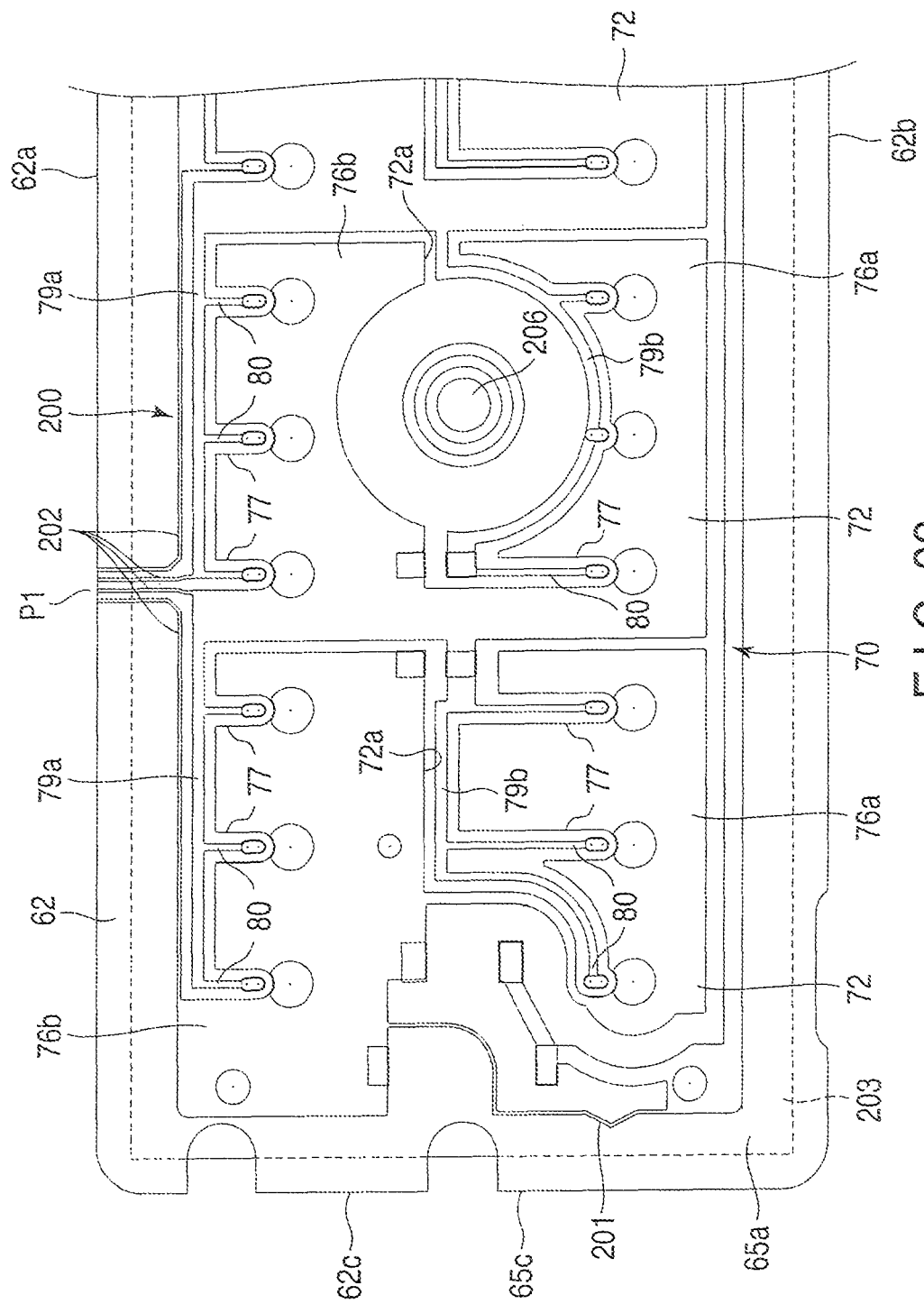
F I G. 22

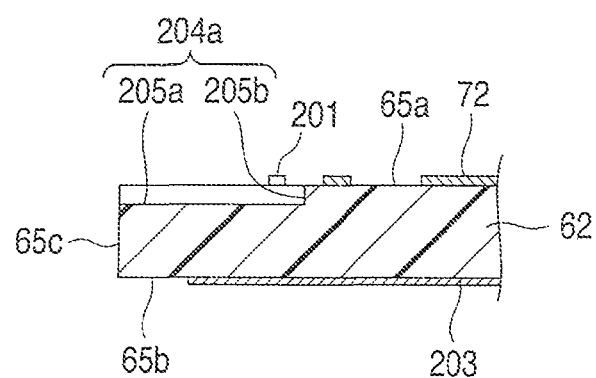
F I G. 24

US 8,816,381 B2

LIGHT-EMITTING DEVICE, METHOD OF MANUFACTURING LIGHT-EMITTING DEVICE, AND ILLUMINATION DEVICE

CROSS-REFERENCE TO RELATED APPLICATIONS

This application is based upon and claims the benefit of priority from Japanese Patent Applications No. 2009-249934, filed Oct. 30, 2009; No. 2010-029541, filed Feb. 12, 2010; and No. 2010-232291, filed Oct. 15, 2010; the entire contents of all of which are incorporated herein by reference.

FIELD

Embodiments described herein relate generally to a light-emitting device using a light-emitting element such as a light-emitting diode, a method of manufacturing the light-emitting device, and an illumination device to which the light-emitting device is mounted.

BACKGROUND

In recent years, illumination devices using a plurality of light-emitting diodes as light source have been put into practical use. The illumination devices of this type are used as, for example, surface-mounted general lighting which is directly mounted on the indoor ceiling. For example, a conventional illumination device disclosed in Jpn. Pat. Appln. KOKAI Pub. No. 2009-54989 comprises a base member, and a plurality of light-emitting devices mounted on the base member. Each light-emitting device has a substrate formed of ceramics, and a plurality of light-emitting diodes. The light-emitting diodes are fixed to the substrate with adhesive made of epoxy resin.

On the other hand, in light-emitting devices using light-emitting diodes as light source, it is desired to efficiently take light emitted by the light-emitting diodes out of the light-emitting device. To satisfy the demand, known is a conventional light-emitting device having a structure in which a plurality of pads, on which light-emitting diodes are mounted, are provided on the substrate, and surfaces of the pads are covered with a light-reflecting layer. The light-reflecting layer is formed on the surfaces of the pads by subjecting the pads to electroplating.

Electroplating has advantages of good close contact of metal coating with product to be treated, and inexpensive manufacturing cost. In the light-emitting device, however, since a plurality of pads are arranged at intervals on the substrate, when the pads are subjected to electroplating, it is necessary to electrically connect the pads by a dedicated conductor pattern, and maintain all the pads at the same potential.

In addition, the conductor pattern becomes redundant after electroplating is finished. Therefore, it is necessary to perform work in which the conductor pattern is removed from the substrate by boring a number of holes in the substrate along the conductor pattern, and electrical connection between the pads by the conductor pattern is severed. The work of boring holes in the substrate has a large number of steps, and requires much time and labor. This decreases productivity and increases the cost of producing the light-emitting device.

BRIEF DESCRIPTION OF THE DRAWINGS

FIG. 12 is a plan view of a light-emitting device according to a third embodiment;

FIG. 15 is a plan view of the substrate, illustrating a state where the common line of the second conductor pattern is removed and a sealing member is applied onto the pads on which the light-emitting elements are mounted, in the third embodiment;

FIG. 17 is a cross-sectional view taken along line F17-F17 of FIG. 12;

FIG. 18 is a circuit diagram, illustrating a state where the light-emitting elements are electrically connected, in the third embodiment;

FIG. 20 is a plan view of a substrate used for a light-emitting device of a fifth embodiment;

FIG. 21 is a plan view of the substrate, illustrating a state where electrical connection of pads is severed by a second conductor pattern, in the fifth embodiment;

FIG. 22 is a plan view of the substrate, illustrating a part F22 of FIG. 20 in an enlarged state;

FIG. 24 is a cross-sectional view taken along line F24-F24 of FIG. 23.

DETAILED DESCRIPTION

In general, according to one embodiment, a light-emitting device comprises a substrate, a plurality of pads, and a plurality of light-emitting elements. The pads have conductivity, and are arranged on the substrate. A reflecting layer formed by electroplating is provided on surfaces of the pads. The light-emitting elements are mounted on the respective pads. A depressed part remains on the substrate. The depressed part is formed in the substrate by removing a pattern on the substrate, which is electrically connected with the pads.

The substrate is preferably formed of material which has thermal conductivity lower than that of metal. However, it is possible to use a substrate having a core material formed of metal which has excellent thermal conductivity such as aluminum. In addition, although the pads are preferably used as wiring pattern which supplies electric current to the light-emitting elements, the pads are not limited to being used as wiring pattern. Specifically, there are cases where it is sufficient that the pads have a function of reflecting light emitted by the light-emitting devices, or a function as heat spreader which spreads heat generated by the light-emitting elements.

As the light-emitting elements, it is possible to use semiconductor light-emitting elements such as light-emitting diode chips. The light-emitting elements can be mounted on the substrate by, for example, the chip-on-board method or surface mount method. However, the method of mounting the light-emitting elements on the substrate is not specifically limited. In addition, the specific number of light-emitting elements and pads is not specifically limited.

The pattern which is removed from the substrate is used for maintaining all the pads at the same potential when the pads are subjected to electroplating. In addition, the depressed part is a mark left on the substrate after the pattern is removed from the substrate, and the shape and the size of the depressed part are not specifically limited.

First Embodiment

A first embodiment will be described hereinafter with reference to FIG. 1 to FIG. 10.

Figure 1:
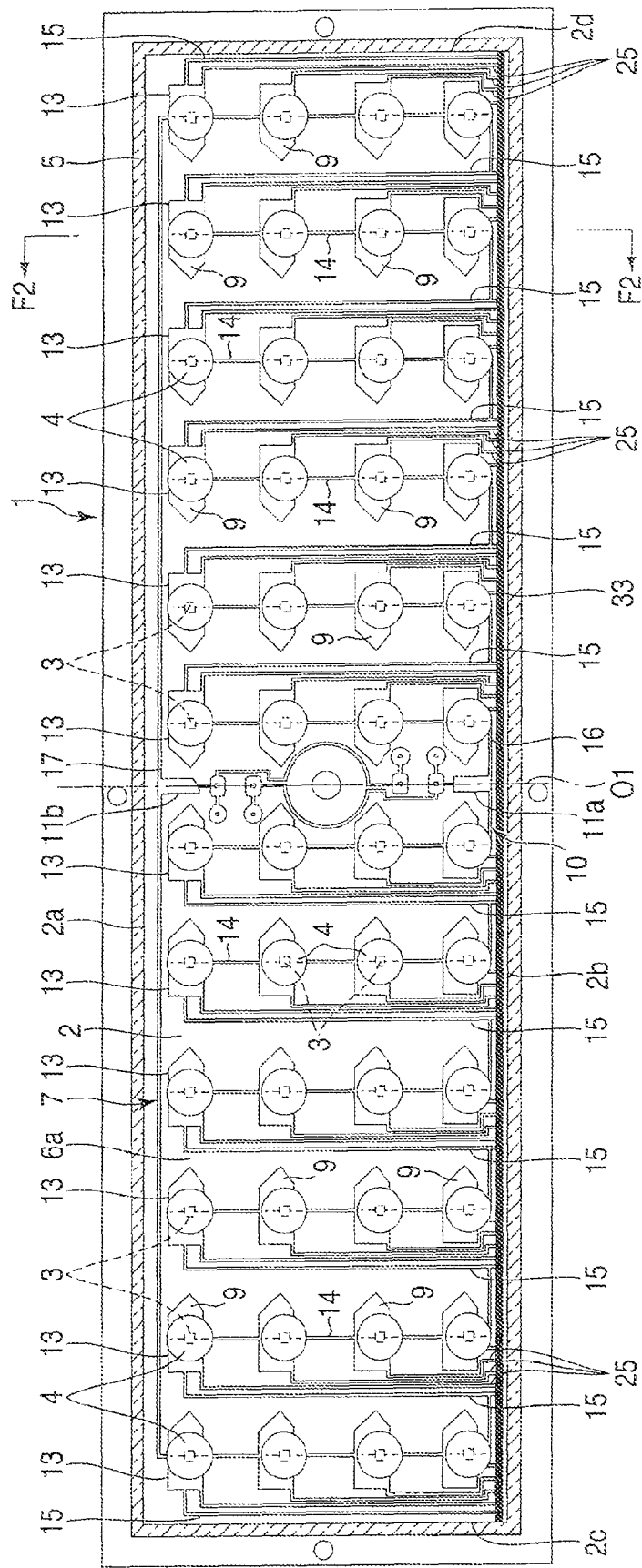
FIG. 1 is a plan view of a light-emitting device according to a first embodiment.
Figure 2:
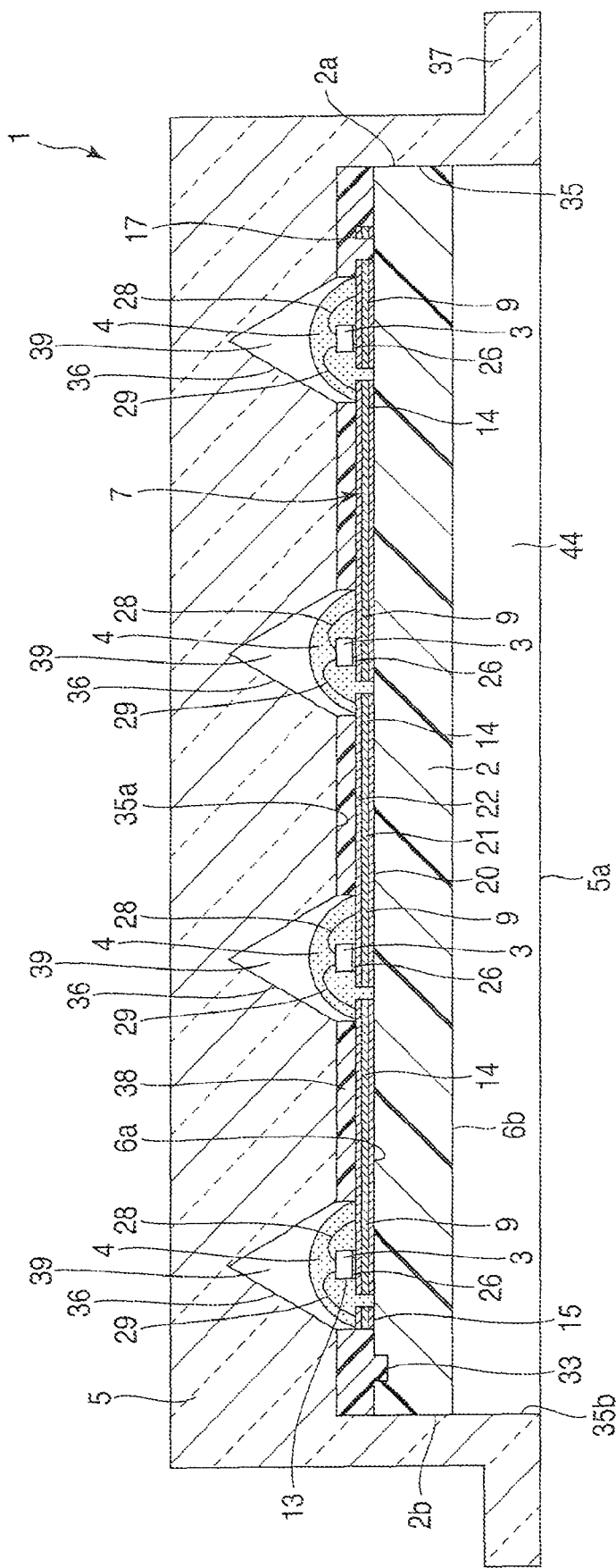
FIG. 2 is a cross-sectional view taken along line F2-F2 of FIG. 1.

FIG. 1 to FIG. 8 illustrate a light-emitting device 1 which serves as illumination light source. As illustrated in FIG. 1 and FIG. 2, the light-emitting device 1 comprises a substrate 2, a plurality of light-emitting elements 3, a plurality of sealing members 4, and a protective cover 5.

The substrate 2 is formed of synthetic resin material, such as glass epoxy resin, which has thermal conductivity lower than that of metal. The material of the substrate 2 is not limited to glass epoxy resin, by other synthetic resin materials or ceramics materials can be used for the substrate 2. Although the substrate 2 is preferably formed of material which has thermal conductivity lower than that of metal, it is possible to adopt a substrate which has a core material formed of metal having excellent thermal conductivity such as aluminum.

As illustrated in FIG. 1 and FIG. 2, the substrate 2 has an elongated shape which has a pair of long sides 2a and 2b, and a pair of short sides 2c and 2d. In addition, the substrate 2 has a first surface 6a, and a second surface 6b positioned opposite to the first surface 6a. The first and the second surfaces 6a and 6b are flat surfaces.

Figure 3:
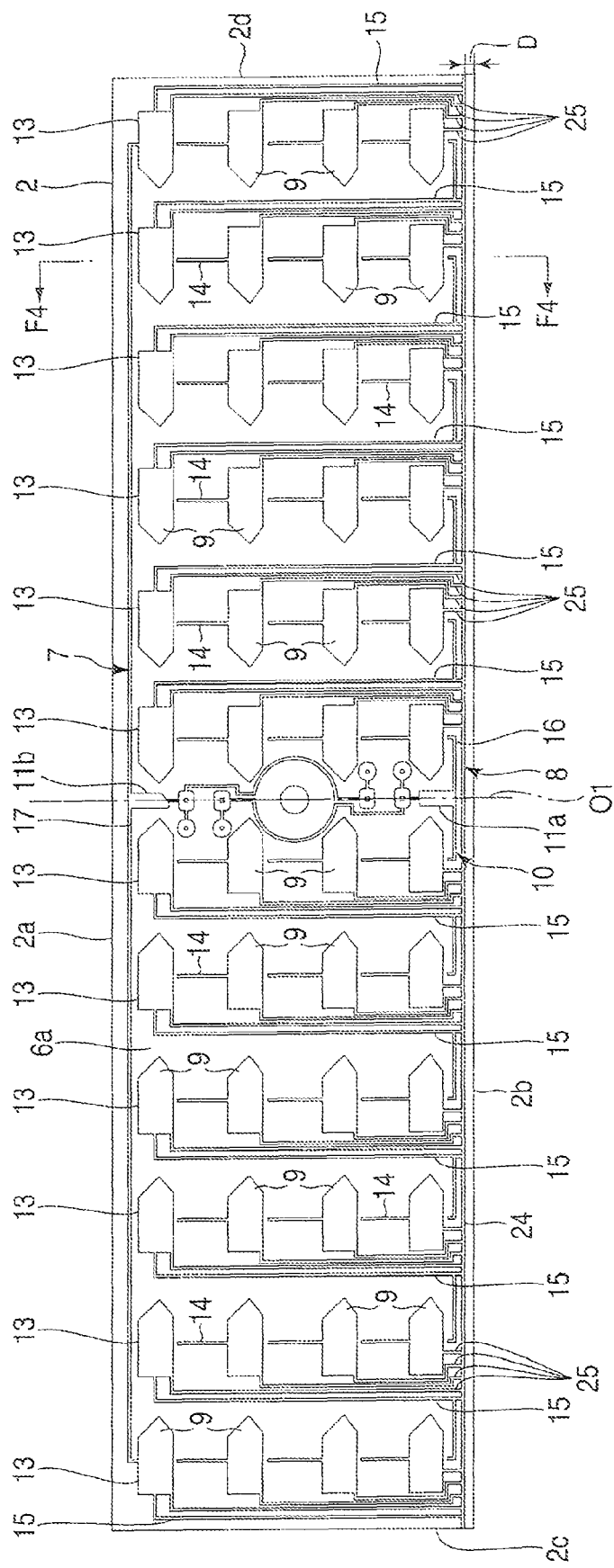
FIG. 3 is a plan view of a substrate which has a first conductor pattern including a plurality of pads, and a second conductor pattern, in the first embodiment.
Figure 4:
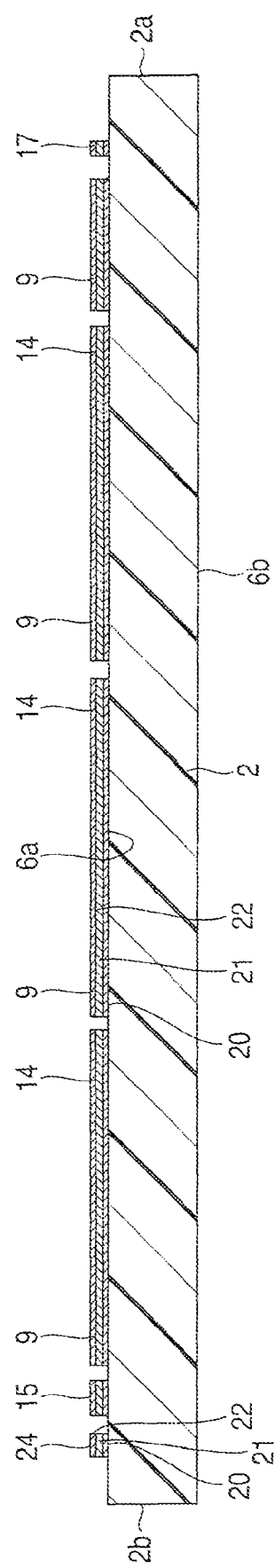
FIG. 4 is a cross-sectional view taken along line F4-F4 of FIG. 3.

As illustrated in FIGS. 3 and 4, a first conductor pattern 7 and a second conductor pattern 8 are formed on the first surface 6a of the substrate 2. The first conductor pattern 7 have a plurality of pads 9 and an power supply conductor 10. Each pad 9 has an almost pentagonal shape in which one end is pointed. In the first embodiment, the pads 9 are arranged in 12 columns at intervals in the longitudinal direction of the substrate 2, and arranged in 4 rows at intervals in a direction perpendicular to the longitudinal direction of the substrate 2.

Therefore, forty-eight pads 9 are regularly arranged in rows and columns on the first surface 6a of the substrate 2. In other words, the forty-eight pads 9 form twelve pad columns 13 which are arranged at intervals in the longitudinal direction of the substrate 2. Each pad column 13 has four pads 9 arranged in the direction perpendicular to the longitudinal direction of the substrate 2.

In addition, the pad columns 13 are divided into six pad columns 13 which are positioned on the right side of a center line O1, which runs through the center of the longitudinal direction of the substrate 2, and six pad columns 13 which are positioned on the left side of the center line O1. The pad columns 13 positioned on the right side of the center line O1 and the pad columns 13 positioned on the left side of the center line O1 are arranged symmetrically with respect to the center line O1.

As illustrated in FIG. 3, in each pad column 13, each of three pads 9 other than one pad 9 adjacent to the long side 2a of the substrate 2 has a wire connecting part 14. Each wire connecting part 14 has a straight-line shape, and extends from an edge of the pad 9 in the direction perpendicular to the longitudinal direction of the substrate 2. A distal end of the wire connecting part 14 is positioned directly before the adjacent pad 9.

The power supply conductor 10 includes a plurality of first power supply patterns 15, a second power supply pattern 16 which has a cathode terminal 11a and a third power supply pattern 17 which has an anode terminal 11b. Each of the first power supply patterns 15 is arranged between adjacent pad columns 13. The second power supply pattern 16 extends along the long side 2b of the substrate 2, in the center part of the substrate 2 along the longitudinal direction of the substrate 2. The third power supply pattern 17 extends over the whole length of the substrate 2 to run along the long side 2a of the substrate 2, and connects two pad columns 13 which are arranged at both ends of the longitudinal direction of the substrate 2. The cathode terminal 11a and the anode terminal 11b are positioned on the center line O1 of the substrate 2. The cathode terminal 11a and the anode terminal 11b are electrically connected to a power supply circuit through lead lines.

As illustrated in FIG. 2, the first conductor pattern 7 including the pads 9 has a three-layer structure including a copper layer 20, a nickel plating layer 21, and a silver plating layer 22. The copper layer 20 is formed by etching a copper foil deposited on the first surface 6a of the substrate 2. The nickel plating layer 21 is formed on the copper layer 20, by subjecting the copper layer 20 to electroplating. The silver plating layer 22 is formed on the nickel plating layer 21, by subjecting the nickel plating layer 21 to electroplating. The silver plating layer 22 covers the nickel plating layer 21, and forms a reflecting layer exposed on the surface of the first conductor pattern 7. Therefore, the surface of the first conductor pattern 7 is a light-reflecting surface. The total light reflectance of the light-reflecting surface is, for example, 90%.

The second conductor pattern 8 is used for maintaining all the pads 9 at the same potential, when the pads 9 of the first conductor pattern 7 are subjected to electroplating. Specifically, the second conductor pattern 8 has a common line 24 and a plurality of branch lines 25. The common line 24 extends in a straight line over the whole length of the substrate 2 to run along the long side 2b of the substrate 2. In addition, the common line 24 is distant from an end edge of the substrate 2, which defines the long side 2b of the substrate 2, by a predetermined distance D. Although the common line 24 is preferably formed in a straight-line shape, but may be formed in, for example, an arc shape or a meandering shape.

The branch lines 25 are branched from the common line 24, and extend in a straight line toward spaces between adjacent pad columns 13. Distal ends of the branch lines 25 are connected to the respective pads 9 of the pad columns 13. Therefore, all the pads 9 are electrically connected to the common line 24 through the branch lines 25.

The second conductor pattern 8 is formed on the first surface 6a of the substrate 2 simultaneously with the first conductor pattern 7, and has a three-layer structure similar to that of the first conductor pattern 7. Specifically, as illustrated in FIG. 4, the second conductor pattern 8 includes the copper layer 20, the nickel plating layer 21, and the silver plating layer 22. The silver plating layer 22 is exposed on the surface of the second conductor pattern 8. Therefore, the surface of the second conductor pattern 8 is also a light-reflecting surface.

In the first embodiment, light-emitting diode chips are used as the light-emitting elements 3. The light-emitting diode chips are, for example, InGaN-based elements, and includes sapphire board which has light transmittance, and a light-emitting layer which is deposited on the sapphire board and emits blue light. The light-emitting layer is formed by depositing an N-type nitride semiconductor layer, an InGaN light-emitting layer, and a P-type nitride semiconductor layer each other.

In addition, each of the light-emitting diode chips includes a positive electrode and a negative electrode, which supply electric current to the light-emitting layer. The positive electrode has a P-type electrode pad which is formed on the P-type nitride semiconductor layer. The negative electrode has an N-type electrode pad which is formed on the N-type nitride semiconductor layer.

The light-emitting elements 3 are individually mounted on the silver plating layer 22 serving as the surfaces of the respective pads 9, by using an adhesive 26 formed of silicone resin. Therefore, in the first embodiment, forty-eight light-emitting elements 3 are regularly arranged in rows and columns on the first surface 6a of the substrate 2. The light-emitting elements 3 are smaller in shape than the pads 9. Therefore, the light-reflecting pads 9 project around the light-emitting elements 3 on the first surface 6a of the substrate 2.

As illustrated in FIG. 2, the positive electrode of each light-emitting element 3 is electrically connected to the pad 9, to which the light-emitting element 3 is affixed, through a bonding wire 28. The negative electrode of each light-emitting element 3 is electrically connected to the wire connecting part 14 of the adjacent pad 9, through another bonding wire 29.

Figure 7:
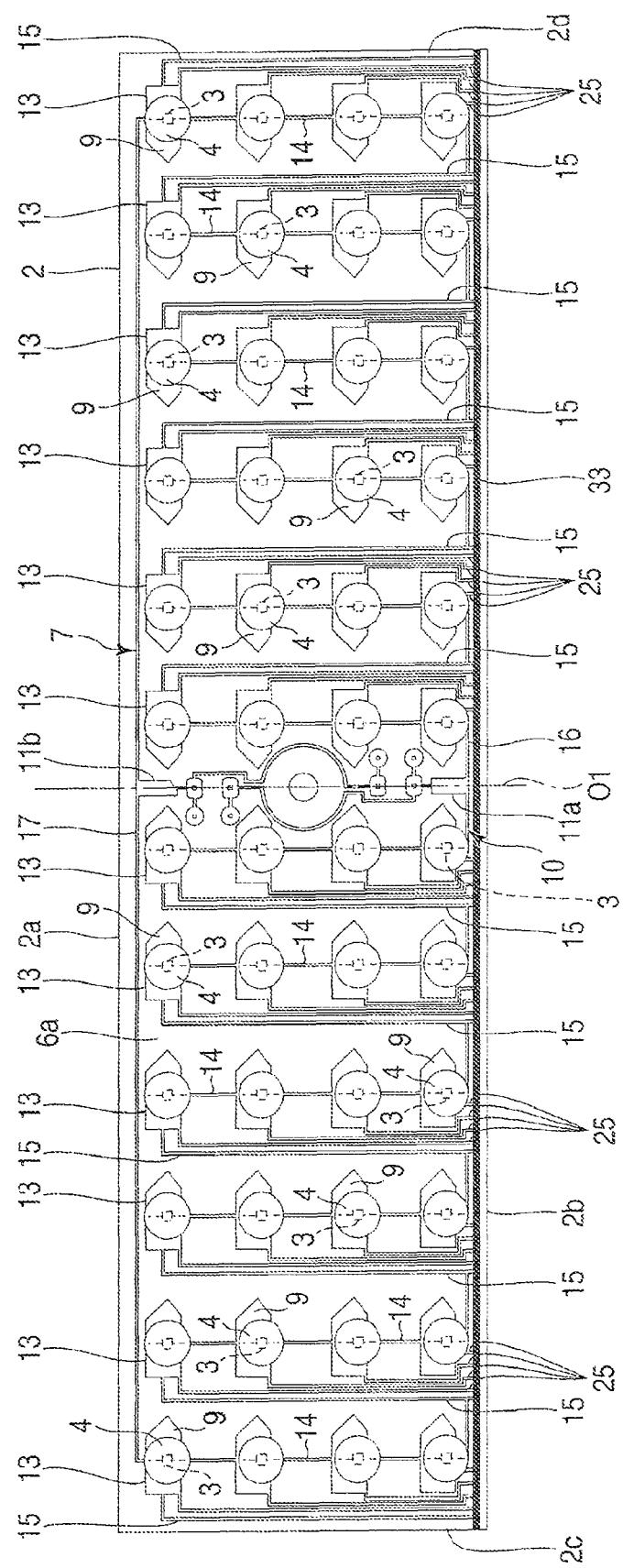
FIG. 7 is a plan view of the substrate in a state where light-emitting elements are mounted on the pads of the first conductor pattern and the light-emitting elements are covered with a sealing member, in the first embodiment.

As illustrated in FIG. 7, in each of the two pad columns 13 which are adjacent to each other with the center line O1 of the substrate 2 interposed therebetween, the negative electrode of the light-emitting element 3 which is affixed to the pad 9 adjacent to the long side 2b of the substrate 2 is electrically connected to the second power supply pattern 16 through the bonding wire 29.

In each of the other pad columns 13, the negative electrode of the light-emitting element 3 which is affixed to the pad 9 adjacent to the long side 2b of the substrate 2 is electrically connected to the first power supply pattern 15 through the bonding wire 29.

As a result, the light-emitting elements 3 are connected in series in each pad column 13, and form twelve light-emitting element columns which correspond to the pad columns. The twelve light-emitting element columns are connected in parallel with the second power supply pattern 16 and the third power supply pattern 17.

In the first embodiment, gold wires are used as the bonding wires 28 and 29. In addition, the bonding wires 28 and 29 are connected to the positive electrodes and the negative electrodes of the light-emitting elements 3 through bumps mainly formed of gold (Au), to improve the mounting strength of the bonding wires 28 and 29 and reduce damage to the light-emitting elements 3.

The second conductor pattern 8, which maintains all the pads 9 of the first conductor pattern 7 at the same potential, is redundant after the pads 9 are subjected to electroplating. Therefore, in the first embodiment, after the pads 9 are subjected to electroplating, the common line 24 of the second conductor pattern 8 is removed, to sever electrical connection between the pads 9 by the second conductor pattern 8.

Figure 5:
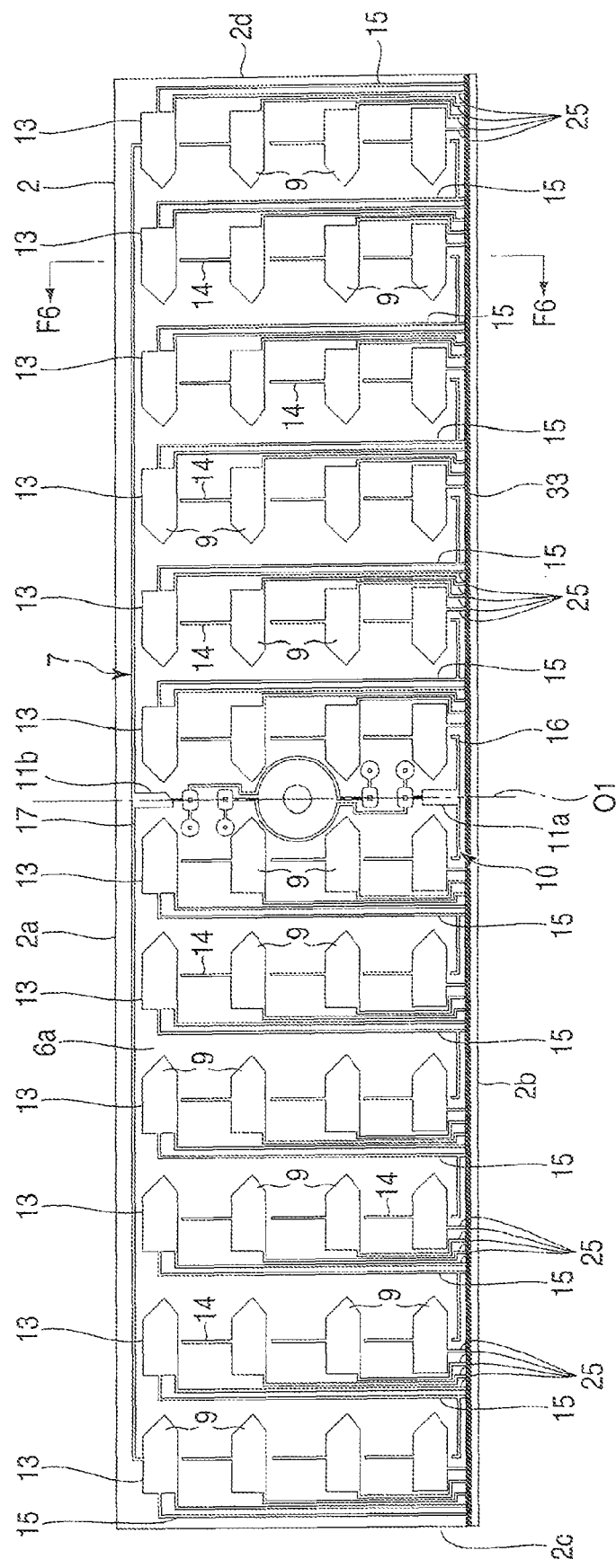
FIG. 5 is a plan view of the substrate in a state where a common line of the second conductor pattern is removed, in the first embodiment.
Figure 6:
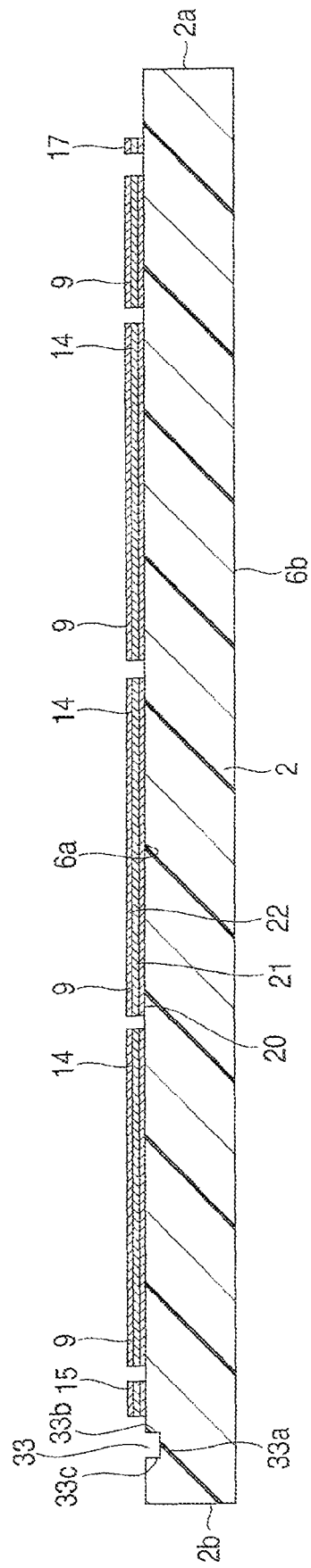
FIG. 6 is a cross-sectional view taken along line F6-F6 of FIG. 5.

As a result, as illustrated in FIG. 5 to FIG. 7, a groove-like depressed part 33 is formed in the first surface 6a. The depressed part 33 is a trace which is left after the common line 24 is removed, and extends in a straight line along the long side 2b of the substrate 2. The depressed part 33 is positioned between the end edge of the substrate 2 which defines the long side 2b of the substrate 2 and the first power supply patterns 15 on the substrate 2, and is distant from the end edge of the substrate 2 by the predetermined distance. The depressed part 33 is defined by a bottom surface 33a and a pair of side surfaces 33b and 33c, and opened to the first surface 6a of the substrate 2. In FIG. 1, FIG. 5 and FIG. 7, the depressed part 33 is painted with black color to clearly distinguish the depressed part 33 from the second conductor pattern 8.

By presence of the depressed part 33, only the branch lines 25 of the second conductor pattern 8 are left on the first surface 6a of the substrate 2. In addition, a creepage distance between the end edge of the substrate 2 which defines the long side 2b of the substrate 2 and the first power supply patterns 15 on the substrate 2 is a value obtained by adding the height of the side surfaces 33b and 33c of the depressed part 33. Therefore, the creepage distance is longer than the clearance between the end edge of the substrate 2 and the first conductor pattern 7 by the depth of the depressed part 33.

The shape of the depressed part 33 is not limited to the first embodiment. For example, the depressed part 33 may have a V-shaped or U-shaped cross section in the direction perpendicular to the longitudinal direction of the substrate 2.

The sealing members 4 are elements for sealing the individual light-emitting elements 3 and the bonding wires 28 and 29 connected to the light-emitting elements 3 on the pads 9, and rise in a hemispherical shape from the respective pads 9. For example, transparent silicone resin having light transmittance is used as the sealing members 4. The silicone resin is applied in a liquid state onto each pad 9. The applied silicone resin is cured by heating or natural drying, and held on each pad 9.

The sealing member 4 contains fluorescent material. The fluorescent material is uniformly dispersed in the sealing members 4. As the fluorescent material, used is yellow fluorescent material which is excited by blue light emitted by the light-emitting elements 3 and emits yellow light. The fluorescent material mixed into the sealing members 4 is not limited to yellow fluorescent material. For example, to improve the color rendering properties of light emitted by the light-emitting elements 3, it is possible to add red fluorescent material which is excited by blue light and emits red light, or green fluorescent material which emits green light, to the sealing members 4.

As illustrated in FIG. 2, the protective cover 5 covers the substrate 2 on which the light-emitting elements 3 are sealed. The protective cover 5 is formed of synthetic resin material having light transmittance, such as transparent acrylic resin and polycarbonate resin. The protective cover 5 includes a receptacle 35 into which the substrate 2 is fitted. The receptacle 35 has a bottom surface 35a which is opposed to the first surface 6a of the substrate 2, and an opening end 35b which is opposed to the bottom surface 35a. The opening end 35b of the receptacle 35 is opened to a back surface 5a of the protective cover 5.

A plurality of depressions 36 are formed in the bottom surface 35a of the receptacle 35. The depressions 36 are arranged in rows and columns on the bottom surface 35a to correspond to the respective light-emitting elements 3. The depressions 36 have a conic shape which has a circular opening part opened to the bottom surface 35a, and are opposed to the respective sealing members 4 covering the light-emitting elements 3. The spherical top parts of the sealing members 4 get into the respective depressions 36 through the opening parts of the depressions 36.

In addition, the protective cover 5 has a flange part 37. The flange part 37 surrounds the opening end 35b of the receptacle 35, and projects from the outer peripheral surface of the protective cover 5 to the outside of the protective cover 5.

As illustrated in FIG. 2, the substrate 2 is fixed within the receptacle 35 of the protective cover 5, by transparent silicone-resin-based adhesive 38. The adhesive 38 is filled into a space between the first surface 6a of the substrate 2 and the bottom surface 35a of the receptacle 35. In the state where the substrate 2 is fixed within the receptacle 35 of the protective cover 5, the opening parts of the depressions 36 are closed with the sealing members 4 and the adhesive 38. As a result, the inside parts of the depressions 36 become closed spaces, and an air layer 39 is formed between the protective cover 5 and the sealing members 4. In addition, in the state where the substrate 2 is fixed within the receptacle 35 of the protective cover 5, the second surface 6b of the substrate 2 is positioned inside the receptacle 35 more than the back surface 5a of the protective cover 5 does.

Next, a process of manufacturing the light-emitting device 1 is explained with reference to FIG. 3 to FIG. 8.

First, the first conductor pattern 7 and the second conductor pattern 8 are formed on the first surface 6a of the substrate 2. Specifically, the foil deposited on the first surface 6a is etched, and thereby a copper layer 20 of the first conductor pattern 7 and a copper layer 20 of the second conductor pattern 8 are formed. Among the copper layer 20 of the first conductor pattern 7, parts which form the pads 9 are electrically connected to each other through the copper layer 20 of the second conductor pattern 8. Therefore, all the parts of the copper layer 20 of the first conductor pattern 7, which form the pads 9, are maintained at the same potential.

In this state, the copper layers 20 of the first and the second conductor patterns 7 and 8 are subjected to electroplating, and thereby a nickel plating layer 21 is formed on the copper layers. Thereafter, the nickel plating layer 21 is subjected to electroplating, and thereby a silver plating layer 22 is formed on the nickel plating layer 21. In the step of performing electroplating, all the parts which form the pads 9 in the copper layer 20 of the first conductor pattern 7 are maintained at the same potential. Therefore, the nickel plating layer 21 and the silver plating layer 22 are formed on the copper layer 20 of the first conductor pattern 7, by using the copper layer 20 of the first conductor pattern 7 as cathode, using the same metal as plating layer as anode, and causing an electric current to flow between the cathode and the anode. The nickel plating layer 21 and the silver plating layer 22 are also formed on the copper layer 20 of the second conductor pattern 8 simultaneously with the first conductor pattern 7.

Thereafter, as illustrated in FIG. 5 and FIG. 6, the common line 24 of the second conductor pattern 8 is removed from the first surface 6a of the substrate 2. Specifically, the common line 24 on the first surface 6a is scraped away by using an electrical tool such as a router and a trimmer. As a result, electrical connection between the pads 9 of the first conductor pattern 7 and the common line 24 is severed, and the pads 9 become electrically independent.

Simultaneously with scraping away the common line 24 from the first surface 6a, a groove-like depressed part 33 is formed in the first surface 6a. The depressed part 33 crosses over the bases of the branch lines 25 branching off from the common line 24. As a result, the branch lines 25 are left on the first surface 6a of the substrate 2, in a state of being electrically separated from each other.

Thereafter, light-emitting elements 3 are affixed on the respective pads 9 of the first conductor pattern 7. Then, the positive electrode of each light-emitting element 3 is electrically connected to the pad 9, to which the light-emitting element 3 is affixed, by bonding wire 28. In the same manner, the negative electrode of each light-emitting element 3 is connected to the wire connecting part 14 of the adjacent pad 9 and the first power supply pattern 15 by bonding wire 29.

Then, sealing members 4 are individually applied onto the respective pads 9 to which the light-emitting elements 3 are affixed, to cover the light-emitting elements 3 and the bonding wires 28 and 29 connected to the light-emitting elements 3 with the sealing members 4. Thereafter, the applied sealing members 4 are cured. Thereby, the light-emitting elements 3 and the bonding wires 28 and 29 are sealed on the first surface 6a of the substrate 2 by the sealing members 4.

Figure 8:
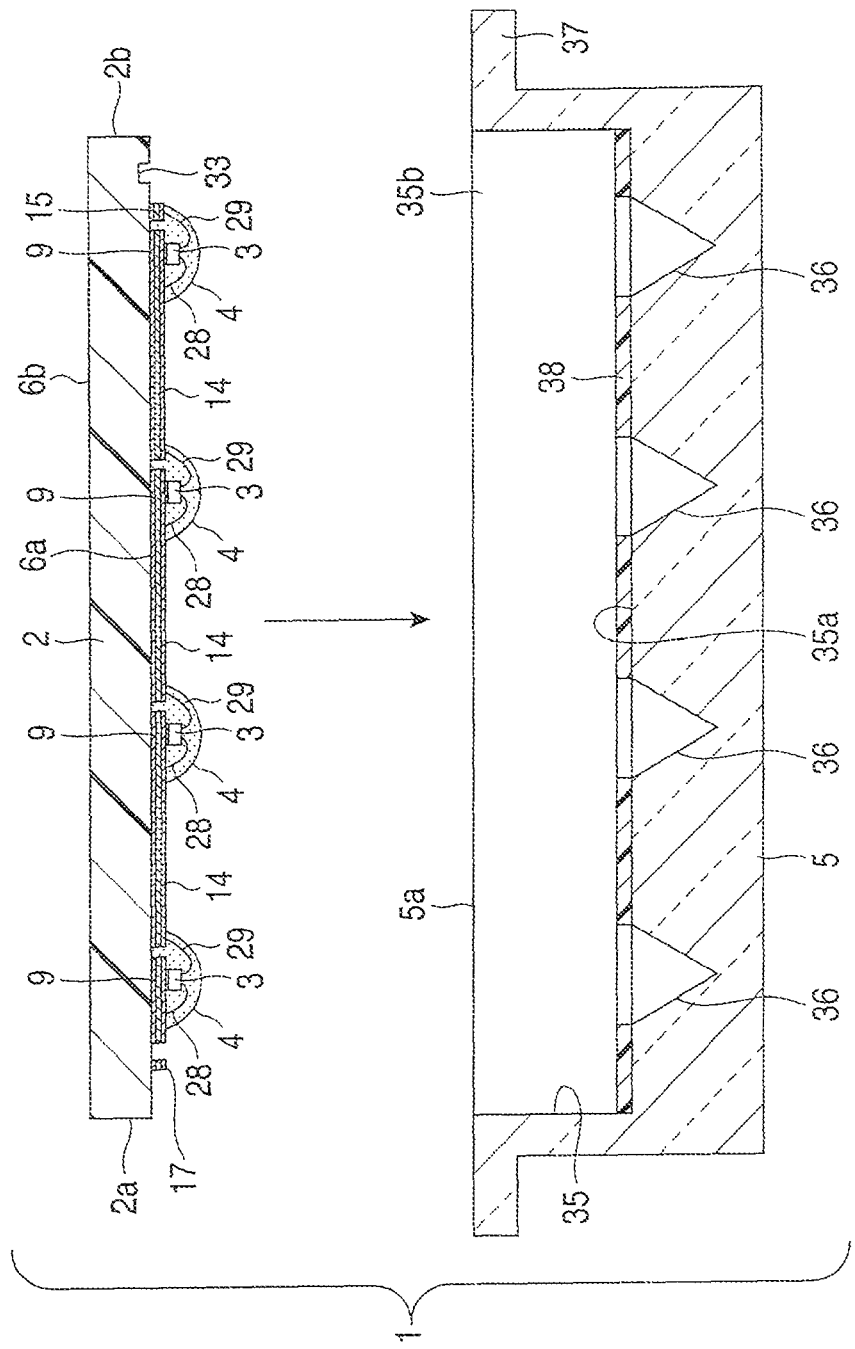
FIG. 8 is a cross-sectional view of the light-emitting device, illustrating a state where a protective cover is separated from the substrate, in the first embodiment.

Next, as illustrated in FIG. 8, the protective cover 5 is held in a position in which the bottom surface 33a of the receptacle 35 of the protective cover 5 faces upward. In this state, silicone-based, adhesive 38 is applied to the bottom surface 33a of the receptacle 35. Then, the substrate 2 on which the light-emitting elements 3 are sealed is deposited in the receptacle 35 of the protective cover 5, and the hemispherical sealing members 4 covering the light-emitting elements 3 are positioned in the opening parts of the depressions 36.

As a result, the first surface 6a of the substrate 2 is affixed to the bottom surface 35a of the receptacle 35 by the silicone-based adhesive 38, and the substrate 2 is united with the protective cover 5. Thereby, a series of manufacturing steps of the light-emitting device 1 is finished.

Figure 9:
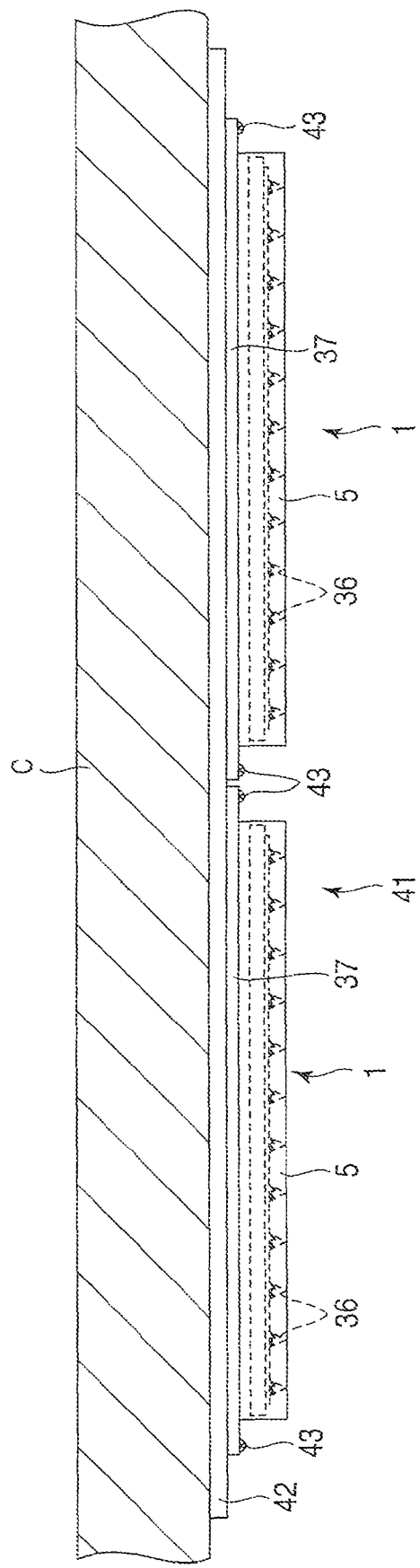
FIG. 9 is a side view of an illumination device in which a pair of the light-emitting devices is fixed to a base, in the first embodiment.
Figure 10:
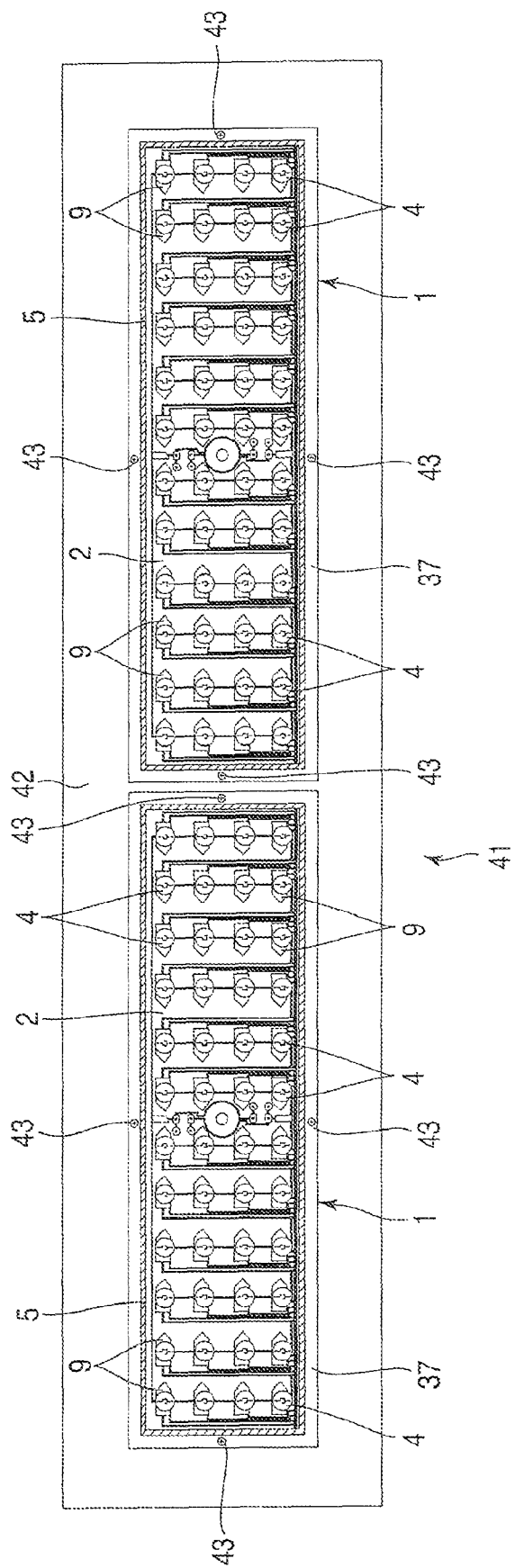
FIG. 10 is a plan view of the illumination device according to the first embodiment.

Next, an illumination device 41 which uses the light-emitting device 1 as light source will be explained hereinafter, with reference to FIGS. 9 and 10 in addition to the above drawings. The illumination device 41 is used by directly attaching the illumination device 41 to, for example, the indoor ceiling C. The illumination device 41 comprises a base 42, and two light-emitting devices 1. The base 42 is an example of a main body of the illumination device 41, and formed in a rectangular shape by using metal material such as aluminum. The base 42 is fixed to the ceiling C by bolts.

The two light-emitting devices 1 are arranged in a straight line along a longitudinal direction of the base 42, and are electrically connected to a power supply unit (not shown) including a power supply circuit. Each light-emitting device 1 is fixed to the base 2 by a plurality of screws 43. The screws 43 are screwed into the base 2 through the flange part 37 of the protective cover 5. Therefore, the protective cover 5 also functions as bracket to fix the light-emitting devices 1 to the base 42.

In a state where the light-emitting devices 1 are fixed to the base 42, the back surface 5a of the protective cover 5 contacts the base 42, and the opening end 35b of the receptacle 35 is closed by the base 42. The second surface 6b of the substrate 2, which is received into the receptacle 35 goes inside the receptacle 35 more than the back surface 5a of the protective cover 5 does, as illustrated in FIG. 2. Therefore, the second surface 6b of the substrate 2 is distant from the base 42. A space between the substrate 2 and the base 42 functions as a thermal insulating layer 44. The thermal insulating layer 44 is not limited to the space. For example, a thermal insulating material may be filled into the space between the substrate 2 and the base 42.

In the illumination device 41 having the above structure, a voltage is applied to the two light-emitting devices 1 through the power supply unit. As a result, the light-emitting elements 3 on the substrate 2 emit light all together. The blue light emitted by the light-emitting elements 3 is made incident on the sealing members 4. Part of the blue light made incident on the sealing members 4 is absorbed into the yellow fluorescent material. The rest of the blue light passes through the sealing members 4, without being absorbed into the yellow fluorescent material.

The yellow fluorescent material which has absorbed the blue light is excited and emits yellow light. Since yellow light passes through the sealing members 4, the yellow light and the blue light are mixed each other inside the sealing members 4, and become white light. The white light passes through the protective cover 5 through the air layer 39, and is guided to the outside of the light-emitting device 1. As a result, the light-emitting device 1 serves as a surface light source which emits white light. The white light emitted by the light-emitting device 1 is used for illuminating the inside of the room from the ceiling.

When the light-emitting devices 1 emit light, heat generated by the light-emitting elements 3 is individually conducted to the pads 9 on the substrate 2. The pads 9 functions as heat spreader which spreads heat conducted from the light-emitting elements 3. The heat which is spread by the pads 9 is mainly conducted from the pads 9 to the protective cover 5, and radiated from the protective cover 5 to the outside of the light-emitting devices 1. Therefore, thermal transmission from the second surface 6b of the substrate 2 to the base 42 of the illumination device 41 is suppressed, and the heat of the light-emitting elements 3 is not easily conducted to the ceiling C.

In the first embodiment, the substrate 2 is formed of synthetic resin material which has thermal conductance lower than that of metal. In addition, the thermal insulating layer 44 is interposed between the substrate 2 and the base 42. As a result, thermal transmission from the substrate 2 to the base 42 is suppressed, and thermal transmission from the substrate 2 to the protective cover 5 is promoted. Therefore, the heat of the light-emitting elements 3 can be positively radiated from the protective cover 5.

According to the first embodiment, the pads 9, to which the light-emitting elements 3 are affixed, project around the light-emitting elements 3. In addition, the pads 9 have light reflectance by virtue of presence of the silver plating layer 22. Therefore, most of light going from the light-emitting elements 9 toward the substrate 2 is reflected by the silver plating layer 22, and guided to a direction in which the light is to be taken out. Thus, the light emitted by the light-emitting elements 3 can be efficiently taken out of the light-emitting devices 1.

In addition, the depressions 36 of the protective cover 5 form the air layer 39 between the sealing members 4 covering the light-emitting elements 3 and the protective cover 5. The light of the light-emitting elements 3 which is transmitted through the sealing members 4 is diffused when it passes through the interface between the air layer 39 and the protective cover 5. The diffused light is transmitted through the protective cover 5, and radiated to the outside of the light-emitting device 1. Therefore, the luminance of the surface of the protective cover 5 is made uniform, and the light-emitting device 1 has good appearance while the light-emitting device 1 is lit.

In addition, the light-emitting device 1 includes the light-transmitting protective cover 5 which covers the substrate 2 and the light-emitting elements 3. Therefore, when the light-emitting device 1 is used as light source of the illumination device 41, it is possible to eliminate a shade and a globe from the illumination device 41. This enables simplifying the structure of the illumination device 41.

The substrate 2 to which the light-emitting elements 3 are affixed is contained in the receptacle 35 of the protective cover 5, and affixed to the bottom surface 35a of the receptacle 35 by the adhesive 38. The adhesive 38 is filled into the space between the bottom surface 35a of the receptacle 35 and the substrate 2, and surrounds the sealing members 4. This structure prevents dust and water from infiltrating the space between the substrate 2 and the protective cover 5. Therefore, the sealing members 4, through which the light of the light-emitting elements 3 is transmitted, are not easily soiled, and it is possible to add a waterproof function to the illumination device 41.

In addition, the sealing members 4 are applied to the substrate 2, to individually cover the forty-eight light-emitting elements 3 and the bonding wires 28 and 29 which are connected to the respective light-emitting elements 3. Therefore, it is possible to reduce the quantity of the silicone resin and the fluorescent material added to the silicone resin, in comparison with the case where all the light-emitting elements 3 are continuously covered with silicone resin. This is advantageous for suppressing the cost of the light-emitting device 1.

On the other hand, the second conductor pattern 8, which maintains all the pads 9 at the same potential when the pads 9 of the first conductor pattern 7 are subjected to electroplating, is formed of the common line 4 and a plurality of branch lines 25 which connect the common line 24 to the pads 9.

Therefore, electrical connection between the pads 9 achieved by the second conductor pattern 8 can be severed by scraping off the common line 24 by an electrical tool or the like. In addition, since the common line 24 has a simple shape which extends in a straight line along the long side 2b of the substrate 2, the common line 24 can be scraped off by simply moving the electrical tool in a straight line along the common line 24. Therefore, it is possible to efficiently and easily perform work of removing the common line 24 from the substrate 2, and improve the productivity of the light-emitting device 1.

In addition, the groove-like depressed part 33 which is left after the common line 24 is scraped off is distant from the end edge of the substrate 2, which defines the long side 2b of the substrate 2, by the predetermined distance, and is positioned between the end edge of the substrate 2 and the first power supply patterns 15 on the substrate 2. As a result, the creepage distance between the end edge of the substrate 2 and the first power supply patterns 15 becomes longer than the clearance between the end edge of the substrate 2 and the first power supply patterns 15, by a length corresponding to the depth of the depressed part 33. Therefore, when an electrical-conductive element is positioned around the substrate 2, it is possible to secure an insulating distance between the electrical-conductive element and the first power supply patterns 15, and dielectric strength of the substrate 2 is improved.

Second Embodiment

Figure 11:
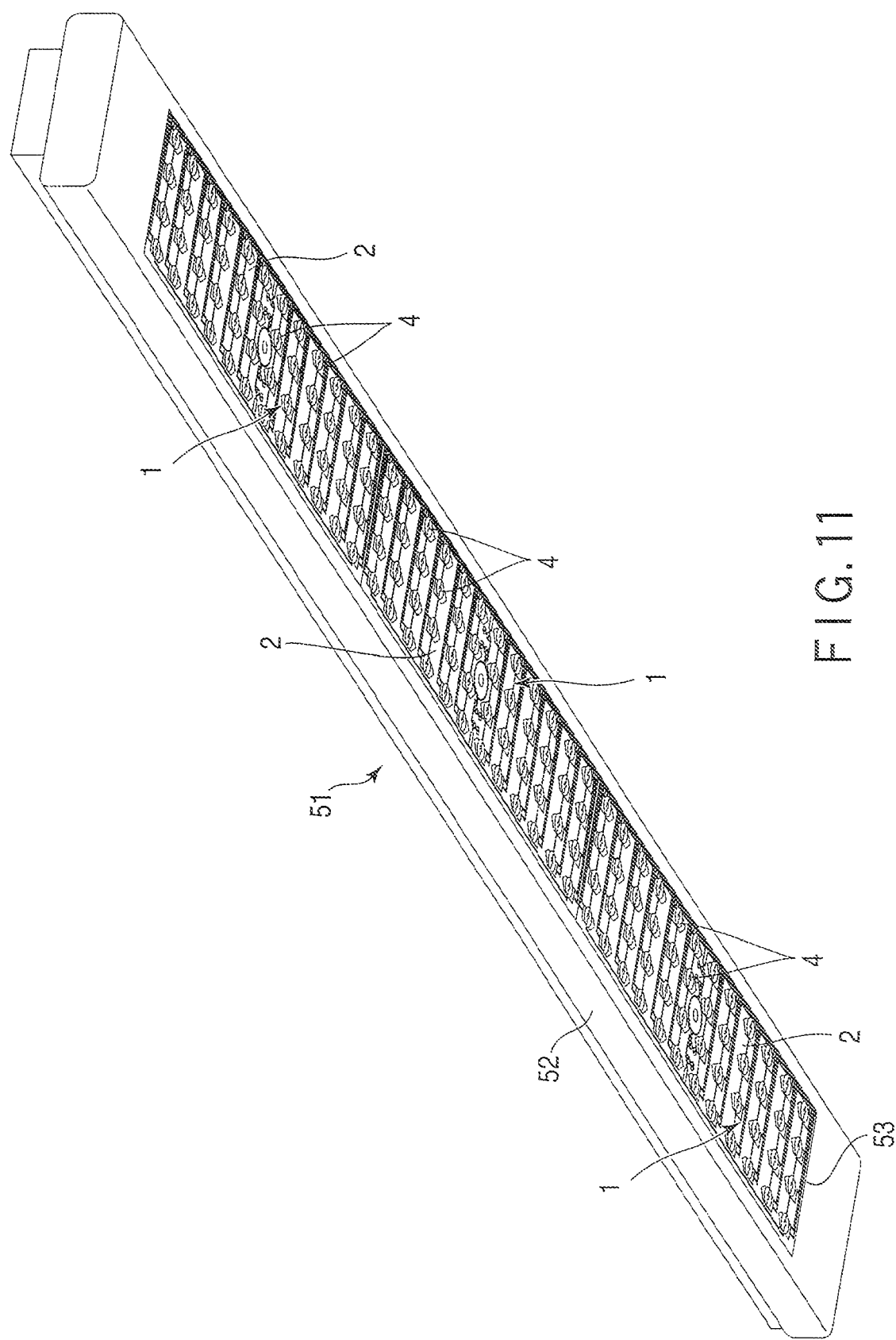
FIG. 11 is a perspective view of an illumination device according to a second embodiment.

FIG. 11 discloses an illumination device 51 according to a second embodiment.

The illumination device 51 uses three light-emitting devices 1 as light source. The structure of the light-emitting device 1 is the same as that of the first embodiment. In FIG. 11, a protective cover is omitted to show the internal structure of the light-emitting devices 1.

As illustrated in FIG. 11, the illumination device 51 includes a case 52 which is surface-mounted on the ceiling. The case 52 is an example of a main body of the illumination device 51. The case 52 has an elongated box shape, and has an elongated opening part 53 which is opened downward. The three light-emitting devices 1 and a power supply unit which lights the three light-emitting devices 1 are contained in the case 52. The light-emitting devices 1 are arranged in line along a longitudinal direction of the case 52. The protective cover of each light-emitting device 1 is exposed from the opening part 53 of the case 52 to the outside of the case 52. In other words, the protective cover of each light-emitting device 1 covers the opening part 53 of the case 52 from the inside of the case 52. Therefore, the case 52 does not need a dedicated translucent cover which covers the opening part 53.

According to the second embodiment described above, it is possible to provide the illumination device 51 which has the same effect as that of the first embodiment.

Third Embodiment

FIG. 12 to FIG. 18 disclose a light-emitting device 61 according to a third embodiment.

The light-emitting device 61 which serves as illumination light source comprises a substrate 62, a plurality of light-emitting elements 63, and a pair of sealing members 64*a* and 64*b*. The substrate 62 is formed of a synthetic resin material such as glass epoxy resin. The substrate 62 has an elongated shape which has a pair of long sides 62*a* and 62*b*, and a pair of short sides 62*c* and 62*d*. In addition, the substrate 62 has a first surface 65*a*, a second surface 65*b* positioned opposite to the first surface 65*a*, and an outer peripheral surface 65*c* which connects the first surface 65*a* with the second surface 65*b*. The first and the second surfaces 65*a* and 65*b* are flat surfaces. According to the second embodiment, a length of the substrate 62 along the long sides 62*a* and 62*b* is 230 mm, and a width of the substrate 62 along the short sides 62*c* and 62*d* is 35 mm. In addition, a thickness of the substrate 62 is preferably 0.5 mm to 1.8 mm. In the second embodiment, the substrate 62 having a thickness of 1.0 mm is used.

A plurality of piercing parts 66 are formed at end edges which define the long sides 62*a* and 62*b* of the substrate 62. The piercing parts 66 are arc-shaped cut-away portions which are opened to the outer peripheral surface 63*c* of the substrate 62, and pierce through the substrate 62 in a thickness direction. In addition, the piercing parts 66 are arranged at intervals in the longitudinal direction of the substrate 62.

A plurality of screws 68 are inserted through the respective piercing parts 66. The screws 68 are an example of fixing parts which fix the substrate 62 to a base of the illumination device, and are screwed into the base through the piercing parts 66. In a state where the screws 68 are screwed into the base, the end edge of the substrate 62 is held between head parts of the screws 68 and the base. Thereby, the substrate 62 is fixed to the base.

Figure 13:
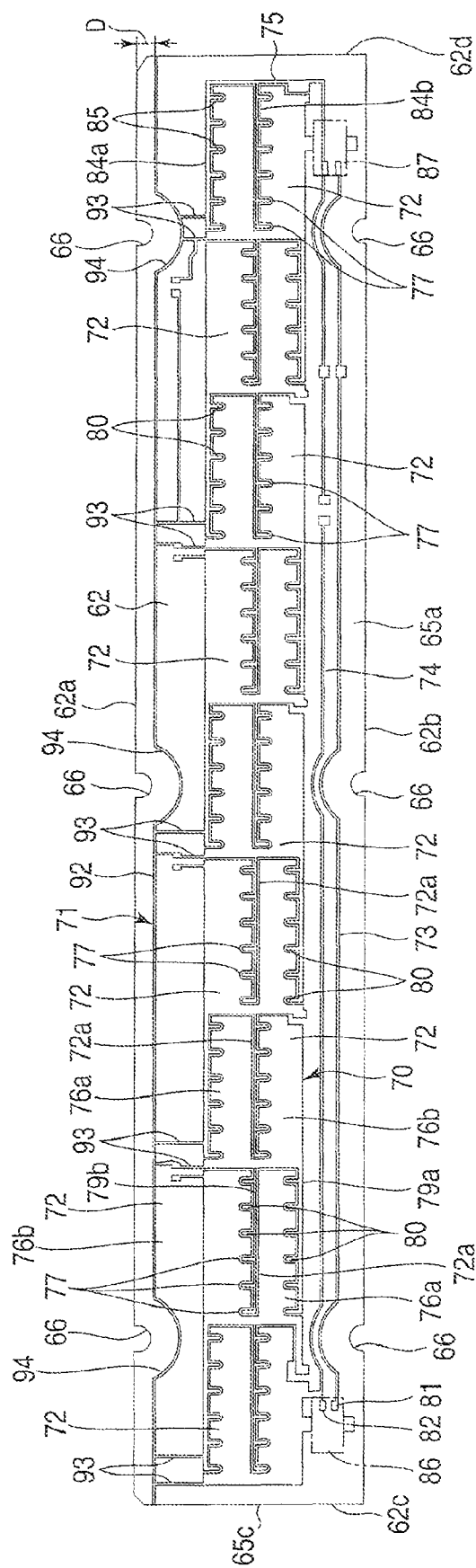
FIG. 13 is a plan view of a substrate which has a first conductor pattern including a plurality of pads, and a second conductor pattern, in the third embodiment.

As illustrated in FIG. 13, a first conductor pattern 70 and a second conductor pattern 71 are formed on the first surface 65*a* of the substrate 62. The first conductor pattern 70 includes, for example, nine pads 72, a positive power supply conductor 73, a negative power supply conductor 74, and a relay conductor 75. The pads 72 have a rectangular shape, and are arranged in line at intervals in the longitudinal direction of the substrate 62.

Each pad 72 is divided into a first mounting area 76*a* and a second mounting area 76*b* by a slit 72*a*. The slit 72*a* extends in the center part of the pad 72 in a straight line in the longitudinal direction of the substrate 62, and is opened to one end of the pad 72. Six depressed parts 77 are formed in the first mounting area 76*a* of each pad 72. The depressed parts 77 are opened to one side edge of the pad 72, and arranged in line at intervals in the longitudinal direction of the substrate 62. In the same manner, six depressed parts 77 are formed in the second mounting area 76*b* of each pad 72. The depressed parts 77 are opened to the slit 72*a*, and arranged in line at intervals in the longitudinal direction of the substrate 62.

As illustrated in FIG. 13, each of the pads 72 other than one pad 72 positioned at the left end of the substrate 62 has a pair of extension parts 79*a* and 79*b*. The extension parts 79*a* and 79*b* extend in straight line from one end of the pad 72 in the longitudinal direction of the substrate 62, and are arranged in parallel with each other at an interval. Each of the extension parts 79*a* and 79*b* has six power supply terminals 80. The power supply terminals 80 project from the extension parts 79*a* and 79*b*, and are arranged in line at intervals in the longitudinal direction of the substrate 62.

One extension part 79*a* of each pad 72 extends along one side edge of the adjacent pad 72. The power supply terminals 80 of the extension part 79*a* are inserted into the respective depressed parts 77 opened to one side edge of the pad 72. The extension part 79*a* and the side edge of the pad 72 are electrically separated by providing an insulating space between them. In the same manner, the power supply terminals 80 of the extension part 79*a* and the depressed parts 77 are electrically separated by providing insulating spaces between them.

The other extension part 79*b* of each pad 72 is inserted into the slit 72*a* of the adjacent pad 72. The power supply terminals 80 of the extension part 79*b* are inserted into the respective depressed parts 77 opened to the slit 72*a*. The extension part 79*b* and the pad 72 are electrically separated by providing an insulating space positioned inside the slit 72*a*. In the same manner, the power supply terminals 80 of the extension part 79*b* and the depressed parts 77 are electrically separated by providing insulating spaces between them.

Therefore, as is clear from FIG. 13, the pads 72 are arranged in line in the longitudinal direction of the substrate 62, in a state where the extension parts 79*a* and 79*b* are alternately reversed in the width direction of the substrate 62.

As illustrated in FIG. 13, the positive power supply conductor 73 extends over the whole length of the substrate 62 to run along the long side 62*b* of the substrate 62. The negative power supply conductor 74 extends along the longitudinal direction of the substrate 62 to run along the long side 62*b* of the substrate 62. The left end of the negative power supply conductor 74 is connected to the pad 72 positioned at the left end of the substrate 62.

The positive power supply conductor 73 has an anode terminal 81. In the same manner, the negative power supply conductor 74 has a cathode terminal 82. The anode terminal 81 and the cathode terminal 82 are aligned at an interval in the left end part of the substrate 62.

The relay conductor 75 extends along the longitudinal direction of the substrate 62 to run along the long side 62*b* of the substrate 62. The relay conductor 75 is positioned in a right end part of the substrate 62. The relay conductor 75 includes a pair of power supply patterns 84*a* and 84*b*. The power supply patterns 84*a* and 84*b* extend in a straight line in the longitudinal direction of the substrate 62, and are arranged in parallel with each other with a space between them. Each of the power supply patterns 84a and 84b has six power supply terminals 85. The power supply terminals 85 project from the power supply patterns 84a and 84b, and are arranged in line at intervals in the longitudinal direction of the substrate 62.

One power supply pattern 84a extends along one side edge of the pad 72 positioned at the right end of the substrate 62. The power supply terminals 85 of the power supply pattern 84a are inserted into the respective depressed parts 77 opened to the side edge of the pad 72. The power supply pattern 84a and the side edge of the pad 72 are electrically separated by providing an insulating space between them. In the same manner, the power supply terminals 85 of the power supply pattern 84a and the depressed parts 77 of the pad 72 are electrically separated by providing insulating spaces between them.

The other power supply pattern 84b is inserted into the slit 72a of the pad 72 positioned at the right end of the substrate 62. The power supply terminals 85 of the power supply pattern 84b are inserted into the respective depressed parts 77 opened to the slit 72a. The power supply pattern 84b and the pad 72 are electrically separated by providing an insulating space between them. In the same manner, the power supply terminals 85 of the power supply pattern 84b and the depressed parts 77 of the pad 72 are electrically separated by providing insulating spaces between them.

As illustrated in FIG. 12 and FIG. 13, a power supply connector 86 is soldered to the anode terminal 81 and the cathode terminal 82. The power supply connector 86 is positioned on the first surface 65a of the substrate 62, and electrically connected to the power supply circuit through lead lines 86a. In addition, the negative power supply conductor 74 and the relay conductor 85 are short-circuited through a relay connector 87.

As illustrated in FIG. 17, the first conductor pattern 70 including the pads 72 has a three-layer structure including a copper layer 88, a nickel plating layer 89, and a silver plating layer 90. The copper layer 88 is formed by etching a copper foil deposited on the first surface 65a of the substrate 62. The nickel plating layer 89 is formed on the copper layer 88 by subjecting the copper layer 88 to electroplating. The silver plating layer 90 is formed on the nickel plating layer 89 by subjecting the nickel plating layer 89 to electroplating. The silver plating layer 90 covers the nickel plating layer 89, and forms a reflecting layer which is exposed to the surface of the first conductor pattern 70. Therefore, the surface of the first conductor pattern 70 is a light-reflecting surface.

The nickel plating layer 89 preferably has a thickness of 5 μm or more. In the same manner, the silver plating layer 90 preferably has a thickness of 1 μm or more. Specifying the thicknesses of the nickel plating layer 89 and the silver plating layer 90 like this solves the problem of variations in thicknesses of the nickel plating layer 89 and the silver plating layer 90, and makes the light reflectance of all the pads 72 uniform.

The second conductor pattern 71 is used for maintaining all the pads 72 at the same potential when the pads 72 of the first conductor pattern 70 to electroplating. Specifically, the second conductor pattern 71 includes a common line 92 and a plurality of branch lines 93 as illustrated in FIG. 13. The common line 92 extends in a straight line over the whole length of the substrate 62 to run along the long side 62a of the substrate 62. Simultaneously, the common line 92 is distant from the end edge of the substrate 62, which defines the long side 62a of the substrate 62, by a predetermined distance D.

In addition, the common line 92 has a plurality of curved parts 94 in positions corresponding to the piercing parts 66 of the substrate 62. The curved parts 94 are curved in arc shape in a direction going away from the edges of the piercing parts 66. By presence of the curved parts 94, the common line 92 is distant from the edges of the piercing parts 66, by at least the same distance as the distance D in the parts corresponding to the piercing parts 66.

The branch lines 93 are branched from the common line 92, and extend in a straight line toward the pads 72. The branch lines 93 are arranged at intervals in the longitudinal direction of the substrate 62. Distal ends of the branch lines 93 are electrically connected to all the pads 72 and the power supply pattern 84a of the relay conductor 75. In other words, all the pads 72 and the relay conductor 75 are electrically connected to the common line 92 through the branch lines 93.

The second conductor pattern 71 is formed on the first surface 65a of the substrate 62 simultaneously with the first conductor pattern 70, and has the same three-layer structure as that of the first conductor pattern 70. Therefore, the surface of the second conductor pattern 71 is formed of a silver plating layer, and has light reflectance.

Each light-emitting element 63 is a light-emitting diode chip as in the first embodiment, and has a positive electrode and a negative electrode. The light-emitting elements 63 are affixed to the first mounting areas 76a and the second mounting areas 76b of the pads 72 by a silicone-resin-based adhesive 96. Specifically, six light-emitting elements 63 are arranged in the first mounting area 76a of each pad 72 in line at intervals in the longitudinal direction of the substrate 62, and six light-emitting elements 63 are arranged in the second mounting area 76b of each pad 72 in line at intervals in the longitudinal direction of the substrate 62. Therefore, each pad 72 includes twelve light-emitting elements 63. The light-emitting elements 63 on each pad 72 form two rows of light-emitting elements which are successively arranged in the longitudinal direction of the substrate 62.

Figure 14:
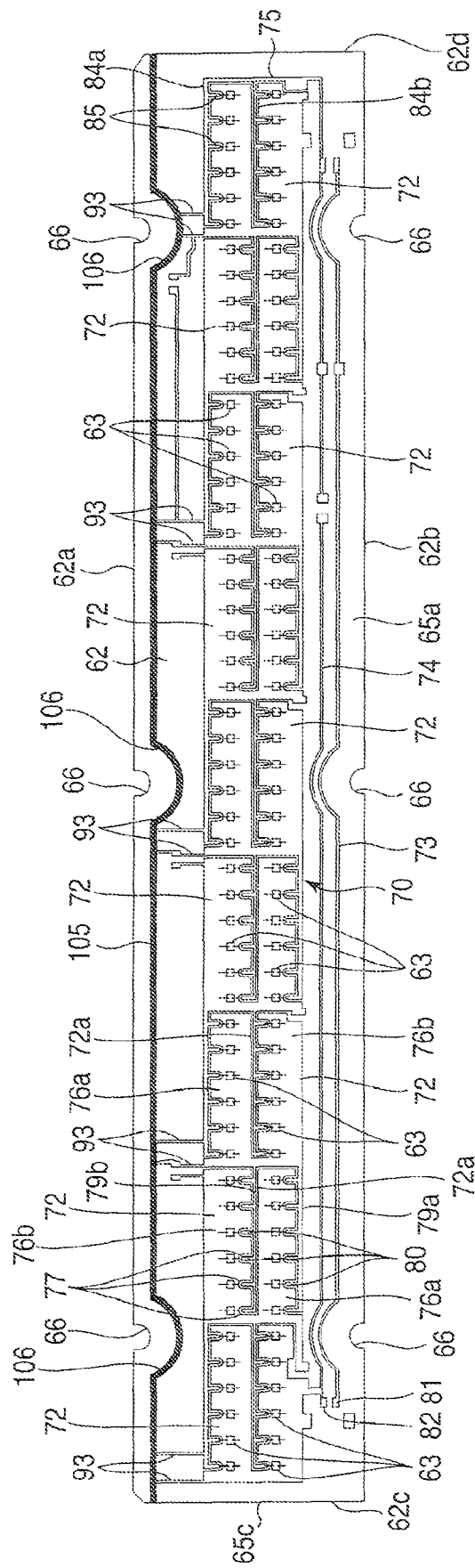
FIG. 14 is a plan view of the substrate, illustrating a state where a common line of the second conductor pattern is removed and a plurality of light-emitting elements are mounted on the pads, in the third embodiment.

As illustrated in FIG. 14 and FIG. 17, the positive electrode of each light-emitting element 63 is electrically connected to the pad 72, to which the light-emitting element 63 is affixed, by a bonding wire 98. The negative electrode of each light-emitting element 63 is electrically connected to the power supply terminals 80 of the adjacent pad 72 and the power supply terminals 85 of the power supply patterns 84a and 84b by another bonding wire 99. Specifically, as illustrated in FIG. 18, the light-emitting device 61 has nine parallel circuits 100a, 100b, 100c, 100d, 100e, 100f, 100g, 100h, and 100i, in each of which twelve light-emitting elements 63 are connected in parallel. In addition, the nine parallel circuits 100a, 100b, 100c, 100d, 100e, 100f, 100g, 100h, and 100i are connected in series.

In addition, in the third embodiment, to prevent malfunction of the light-emitting device 61, capacitor 101 is connected to each of the nine parallel circuits 100a, 100b, 100c, 100d, 100e, 100f, 100g, 100h, and 100i. Simultaneously, a capacitor 101 is also connected to a circuit which connects the parallel circuits 100a, 100b, 100c, 100d, 100e, 100f, 100g, 100h, and 100i in series. The capacitors 101 are mounted on the first surface 65a of the substrate 62.

In the third embodiment, the power supply terminals 80 and 85 to which the bonding wire 99 is connected are inserted into the depressed parts 77 of the adjacent pad 72. In other words, since the power supply terminals 80 and 85 go toward the center parts of the first and the second mounting areas 76a and 76b, the light-emitting elements 63 can be affixed to the center parts of the first and the second mounting areas 76a and 76b, without changing the lengths of the bonding wires 98 and 99. Therefore, it is possible to conduct the heat generated by the light-emitting elements 63 to a wide range of the first and the second mounting areas 76a and 76b, and efficiently radiate the heat from the pads 72.

The second conductor pattern 71 which all the pads 72 at the same potential becomes redundant after the first conductor pattern 70 is subjected to electroplating. Therefore, in the third embodiment, after the first conductor pattern 70 is subjected to electroplating, the common line 92 of the second conductor pattern 71 is removed, to sever electrical connection between the pads 72 obtained by the second conductor pattern 71.

As illustrated in FIG. 14, FIG. 15 and FIG. 17, a depressed part 105 is formed in the first surface 65a of the substrate 62. The depressed part 105 is a trace which is left after the common line 92 is removed, and extends along the long side 62a of the substrate 62. The depressed part 105 is a groove which is defined by a bottom surface 105a and a pair of side surfaces 105b and 105c, and opened to the first surface 65a of the substrate 62.

In addition, the depressed part 105 has a plurality of curved parts 106 in positions corresponding to the piercing parts 66 of the substrate 62. The curved parts 106 are formed in a shape which agrees with the shape of the curved parts 94 of the common line 92, to detour around the piercing parts 66. The depressed part 105 having the above structure is positioned between the end edge of the substrate 62, which defines the long side 62a of the substrate 62, and the pads 72, and distant from the end edge of the substrate 62 by a predetermined distance. According to the third embodiment, the depressed part 105 has a width of 1 mm, and a depth of 0.3 mm.

By presence of the depressed part 105 as described above, only the branch lines 93 of the second conductor pattern 71 remain on the first surface 65a of the substrate 62. The remaining branch patterns 93 are electrically separated. In addition, a creepage distance between the end edge of the substrate 62 which defines the long side 62a of the substrate 62 and the pads 72 is a value obtained by adding the height of the side surfaces 105b and 105c of the depressed part 105. Therefore, the creepage distance is longer than the clearance between the end edge of the substrate 62 and the pads 72 by the depth of the depressed part 105. The shape of the depressed part 105 is not limited to the third embodiment. For example, the depressed part 105 may have a V-shaped or U-shaped cross section in the direction perpendicular to the longitudinal direction of the substrate 62.

The sealing members 64a and 64b are elements for sealing the light-emitting elements 63, which are arranged in two lines, and the bonding wires 98 and 99 on the pads 72. The sealing members 64a and 64b are formed of transparent silicone resin, in which fluorescent material is mixed, and extend in a straight line along the longitudinal direction of the substrate 62.

As illustrated in FIG. 12 and FIG. 17, the first surface 65a of the substrate 62 is covered with a white resist layer 108, except for areas on which parts such as the light-emitting elements 63 and the capacitors 101 are mounted. The resist layer 108 has light reflectance. The resist layer 108 continuously covers the first conductor pattern 70, the branch lines 93, and the depressed part 105. Therefore, the first conductor pattern 70, the branch lines 93 and the depressed part 105 on the first surface 65a of the substrate 62 are not easily viewed.

Figure 16:
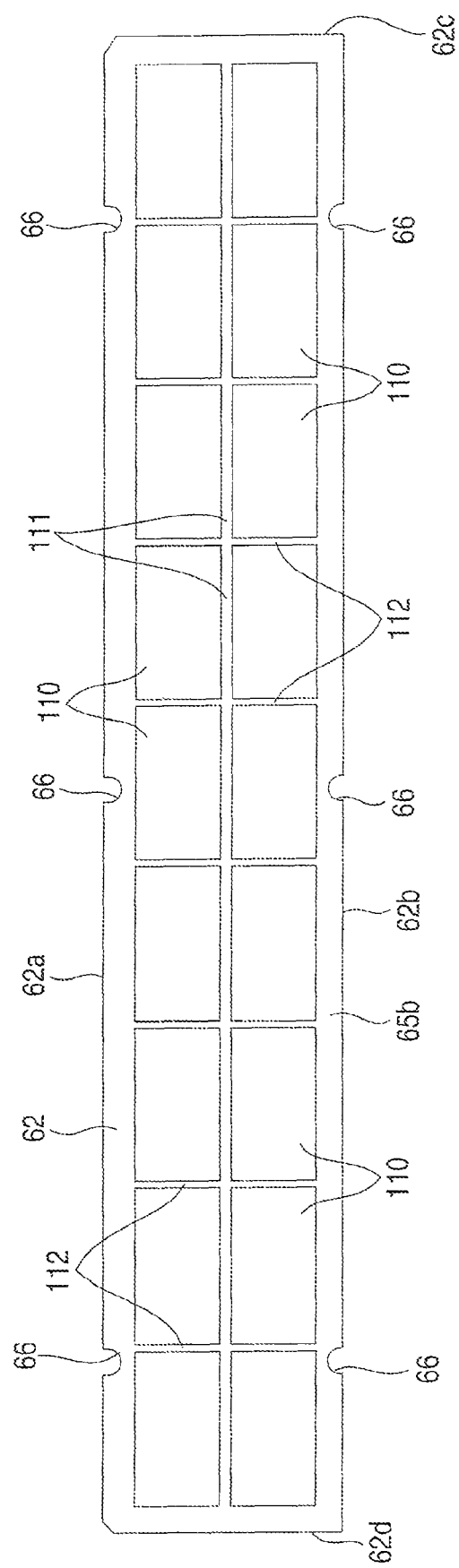
FIG. 16 is a plan view of the substrate, to which a thermally radiative sheet is affixed, in the third embodiment.

As illustrated in FIG. 16 and FIG. 17, eighteen rectangular thermally radiative sheets 110 are deposited on the second surface 65b of the substrate 62. The thermally radiative sheets 110 are an example of conductors, and are formed of a copper foil which has excellent heat conductance. The thermally radiative sheets 110 are arranged in two lines at intervals in the longitudinal direction of the substrate 62, to correspond to the pads 72 of the first surface 65a. The adjacent thermally radiative sheets 110 are thermally separated by a plurality of first slits 111, which extend in the longitudinal direction of the substrate 62, and a plurality of second slits 112 which extend in the direction perpendicular to the longitudinal direction of the substrate 62. In addition, the thermally radiative sheets 110 and the second surface 65b of the substrate 62 is covered with a resist layer 113.

By depositing the thermally radiative sheets 110 on the second surface 65b of the substrate 62, it is possible to equalize temperature distribution of the substrate 62 which receives the heat of the light-emitting elements 63. Therefore, the thermal radiation property of the substrate 62 can be improved. In particular, by providing the second slits 112, which run along the direction perpendicular to the longitudinal direction of the substrate 62, between the adjacent thermally radiative sheets 110, it is possible to suppress a warp and deformation of the substrate 62 due to heat.

Next, a process of manufacturing the light-emitting device 61 will be explained hereinafter with reference to FIG. 13 to FIG. 15.

First, the first conductor pattern 70 and the second conductor pattern 71 are formed on the first surface 65a of the substrate 62. Specifically, the copper foil deposited on the first surface 65a is etched, and thereby copper layers 88 of the first and the second conductor pattern 70 and 71 are formed. Among the copper layer 88 of the first conductor pattern 70, parts which form the pads 72 are electrically connected to each other through the copper layer 88 of the second conductor pattern 71. Therefore, all the parts of the copper layer 88 of the first conductor pattern 70, which form the pads 72, are maintained at the same potential.

In this state, the copper layer 88 of the first conductor pattern 70 is subjected to electroplating, and thereby a nickel plating layer 89 is formed on the copper layer 88. Thereafter, the nickel plating layer 89 is subjected to electroplating, and thereby a silver plating layer 90 is formed on the nickel plating layer 89. In the step of performing electroplating, all the parts which form the pads 72 in the copper layer 88 of the first conductor pattern 70 are maintained at the same potential. Therefore, the nickel plating layer 89 and the silver plating layer 90 are formed on the copper layer 88 of the first conductor pattern 70, by using the copper layer 88 of the first conductor pattern 70 as cathode, using the same metal as plating layer as anode, and causing an electric current to flow between the cathode and the anode. The nickel plating layer 89 and the silver plating layer 90 are also formed on the copper layer 88 of the second conductor pattern 71 simultaneously with the first conductor pattern 70.

Thereafter, as illustrated in FIG. 14, the common line 92 of the second conductor pattern 71 is removed from the first surface 65a of the substrate 62. Specifically, the common line 92 on the first surface 65a is scraped away in the same manner as the first embodiment. As a result, electrical connection between the pads 72 of the first conductor pattern 70 and the second conductor pattern 71 is severed, and the pads 72 are maintained in a state of being electrically independent.

Simultaneously with scraping away the common line 92 from the first surface 65a, a groove-like depressed part 105 is formed in the first surface 65a. The depressed part 105 has the curved parts 106, which are curved to detour around the piercing parts 66, in positions corresponding to the piercing parts 66 of the substrate 62.

The depressed part 105 crosses over the bases of the branch lines 93 branching off from the common line 92. As a result, the branch lines 93 are left on the first surface 65a of the substrate 62, in a state of being electrically separated from each other.

Thereafter, six light-emitting elements 63 are affixed on each of the first and the second mounting areas 76a and 76b of each pad 72. Then, the positive electrodes of the light-emitting elements 63 are electrically connected to the pads 72, to which the light-emitting elements 63 are affixed, by bonding wires 98. In the same manner, the negative electrodes of the light-emitting elements 63 are connected to the power supply terminals 80 of the adjacent pads 72 and the power supply terminals 85 of the power supply patterns 84a and 84b by bonding wires 99.

Then, the light-emitting elements 63 arranged in two lines and the bonding wires 98 and 99 are sealed on the pads 72 by the sealing members 64a and 64b. Thereby, the light-emitting device 61 as illustrated in FIG. 15 is formed.

According to the third embodiment having the above structure, the second conductor pattern 71 which maintains the pads 72 of the first conductor pattern 70 at the same potential is formed of the common line 92 and the branch lines 93 which are branched off from the common line 92 and reach the pads 72. Therefore, electrical connection between the pads 72 obtained by the second conductor pattern 71 can be severed, by removing the common line 92 from the substrate 62.

Therefore, in the same manner as the first embodiment, it is possible to efficiently and easily perform the work of cutting off electrical connection between the pads 72, and improve the productivity of the light-emitting device 61.

In addition, the depressed part 105 which is left after the common line 92 is scraped away is distant from the end edge of the substrate 62 by the predetermined distance, and positioned between the end edge of the substrate 62 and the pads 72. As a result, the creepage distance between the end edge of the substrate 62 and the pads 72 becomes longer than the clearance between the end edge of the substrate 62 and the pads 72, by a length corresponding to the depth of the depressed part 105, and it is possible to secure an insulating distance between the end edge of the substrate 62 and the pads 72.

In addition, according to the third embodiment, the depressed part 105 has the curved parts 106, which are curved to detour around the piercing parts 66, in positions corresponding to the piercing parts 66 of the substrate 62. Therefore, it is possible to equally secure insulating distances from the edges of the piercing parts 66 to the curved parts 106, and increase the dielectric strength of the substrate 62. Thus, even when the screws 68 inserted through the piercing parts 66 are formed of metal, insulation of the screws 68 from the pads 72 can be sufficiently secured, and the reliability of electrical insulation of the light-emitting device 61 can be improved.

Fourth Embodiment

Figure 19:
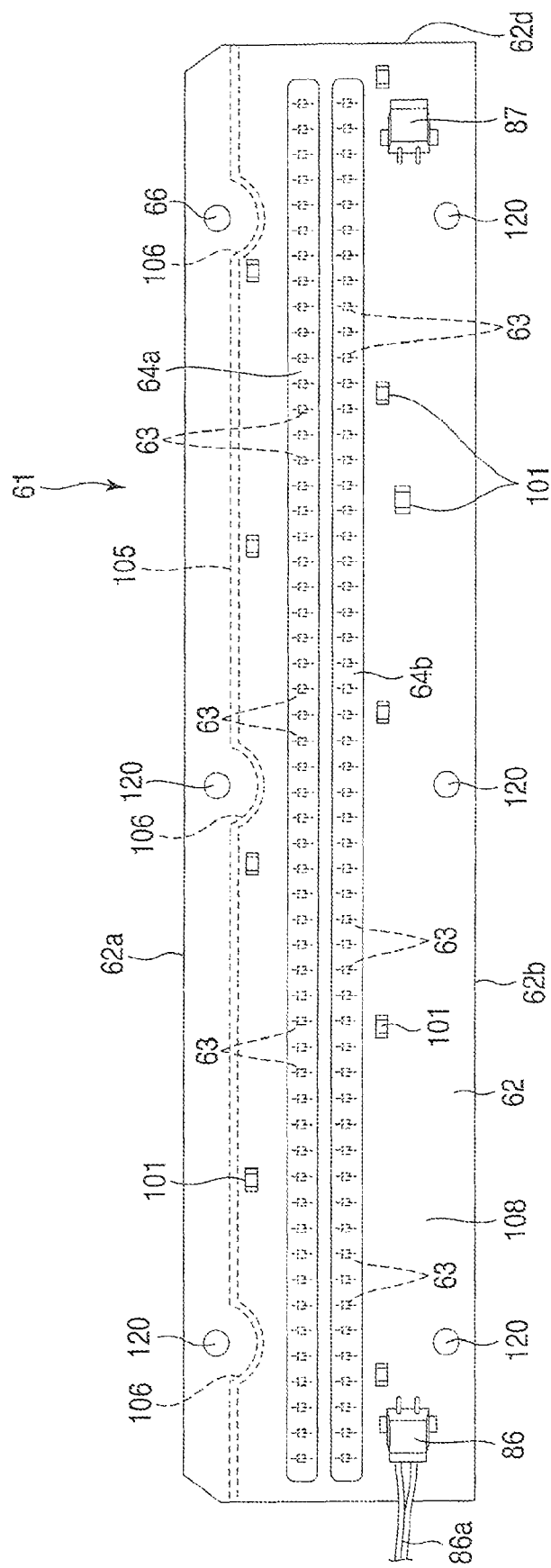
FIG. 19 is a plan view of a light-emitting device according to a fourth embodiment.
Figure 23:
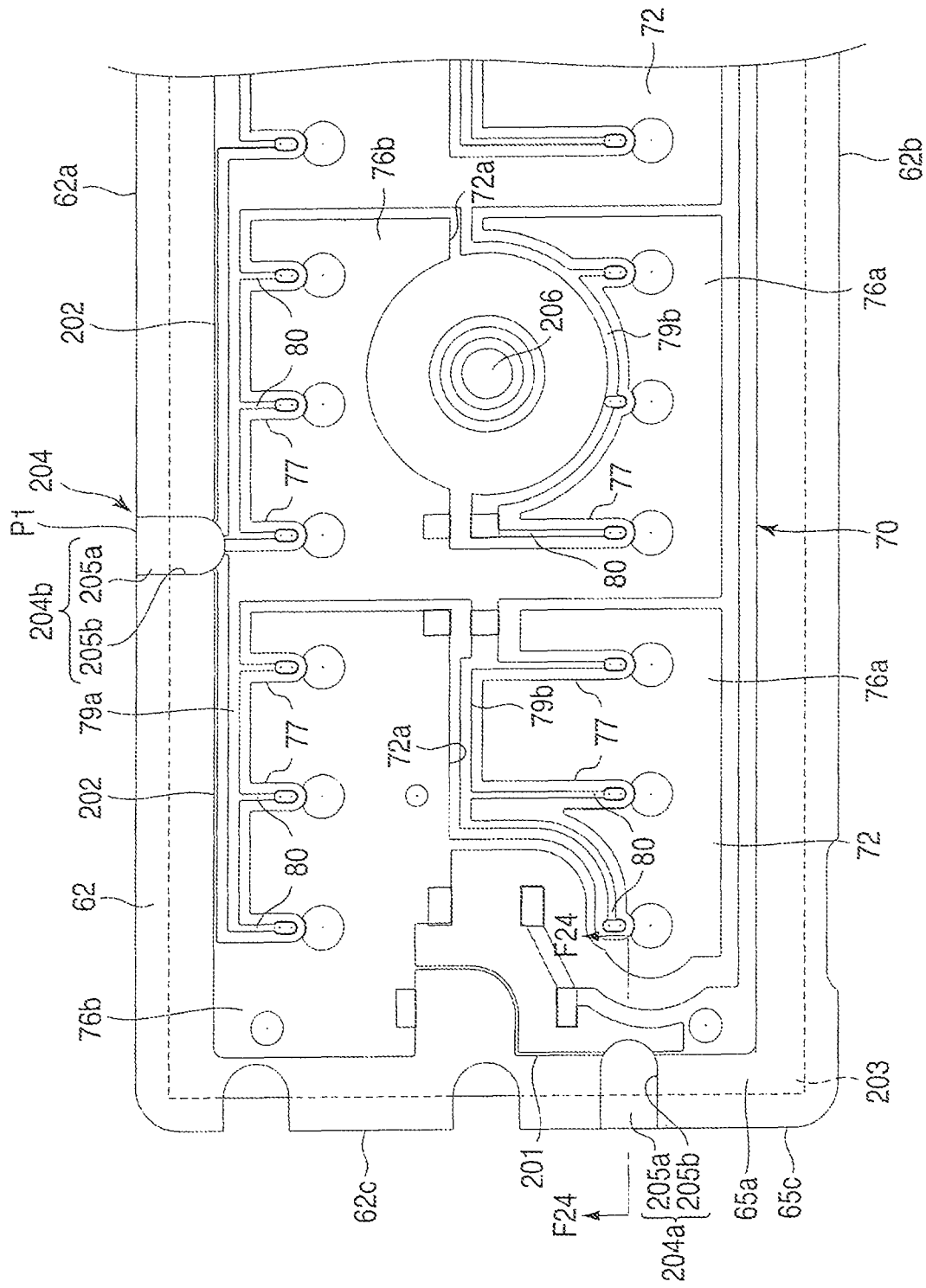
FIG. 23 is a plan view of the substrate, illustrating a part F23 of FIG. 21 in an enlarged state.

FIG. 19 discloses a fourth embodiment.

The fourth embodiment is different from the third embodiment, in that a plurality of through-holes 120 are provided in outer edge parts of a substrate 62 running along long sides 62a and 62b. The other parts of the structure of a light-emitting device 61 are the same as those of the third embodiment.

The through-holes 120 of the substrate 62 are used for inserting screws which fix the substrate 62 to a base of an illumination device. The through-holes 120 are arranged at intervals in a longitudinal direction of the substrate 62. In addition, a depressed part 105 on a first surface 65a of the substrate 62 has a plurality of curved parts 106 in positions corresponding to the through-holes 120. The curved parts 106 are curved in an arc shape in a direction going away from the end edge of the substrate 62, to detour around the through-holes 120.

Also in the fourth embodiment as described above, an insulating distance from the through-holes 120 to the depressed part 105 can be secured, by presence of the curved parts 106. Therefore, the dielectric strength of the substrate 62 is improved and it is possible to sufficiently secure insulation of the screws from pads 72, even when the screws inserted through the through-holes 120 are formed of metal.

Fifth Embodiment

FIG. 20 to FIG. 24 disclose a fifth embodiment.

The fifth embodiment is different from the third embodiment, mainly in the shape of the second conductor pattern and the structure for cutting off electrical connection between pads obtained by the second conductor pattern. The basic structure of the substrate of the fifth embodiment other than these points is the same as that of the third embodiment. Therefore, in the fifth embodiment, constituent elements which are the same as those in the third embodiment are denoted by the same respective reference numerals as those of the third embodiment, and explanation thereof is omitted.

As illustrated in FIG. 20, a first conductor pattern 70 formed on a first surface 65a of a substrate 62 includes fourteen pads 72. The pads 72 are arranged in line at intervals in a longitudinal direction of the substrate 62.

The fourteen pads 72 are electrically connected by a second conductor pattern 200 and maintained at the same potential, before the pads 72 are subjected to electroplating. The second conductor pattern 200 is formed on the first surface 65a of the substrate 62. The second conductor pattern 200 has a relay line 201, and a plurality of connection lines 202. As illustrated in FIG. 20 and FIG. 22, the relay line 201 is positioned at the left end of the substrate 62, and extends along a short side 62c of the substrate 62. The relay line 201 electrically connects the pad 72 located at the left end of the substrate 62 with the first conductor pattern 70.

The connection lines 202 are drawn from the pads 72 and a power supply pattern 84a positioned at the right end of the substrate 62, and arranged between the pads 72 and a long side 62a of the substrate 62. End parts of each connection line 202 located at the end reverse to the pad 72 is guided toward the long side 62a of the substrate 62. According to the fifth embodiment, the end parts of the connection lines 202 are assigned to removal positions P1, P2, P3 and P4 which are set in four positions of the long side 62a of the substrate 62. The removal positions P1, P2, P3 and P4 are arranged at intervals in the longitudinal direction of the substrate 62.

Specifically, as illustrated in FIG. 20 and FIG. 22, the end parts of the four connection lines 202 which correspond to the first pad 72, located at the left end of the substrate 62, to the fourth pad 72 are guided to removal position P1 and collected therein. The end parts of the four connection lines 202 which correspond to the fifth pad 72 to the eighth pad 72 are guided to removal position P2 and collected therein. The end parts of the four connection lines 202 which correspond to the ninth pad 72 to the twelfth pad 72 are guided to removal position P3 and collected therein. The end parts of the two connection lines 202 which correspond to the thirteenth pad 72 to the fourteenth pad 72, and the end part of the connection line 202 which corresponds to the power supply pattern 84a are guided to removal position P4 and collected therein. The end parts of the connection lines 202 guided to each of the removal positions P1, P2, P3 and P4 are electrically connected to each other.

In addition, in the fifth embodiment, a thermally radiative sheet 203 is deposited on a second surface 65b of the substrate 62. The thermally radiative sheet 203 is an example of a conductor, and formed of metal material which has excellent heat conductance such as copper foil. The thermally radiative sheet 203 covers the whole of the second surface 65b of the substrate 62.

The second conductor pattern 200 becomes redundant after the pads 72 are subjected to electroplating. Therefore, in the fifth embodiment, after the pads 72 are subjected to electroplating, electrical connection between the pads 72 obtained by the second conductor pattern 200 is severed.

Specifically, part of the short side 62c of the substrate 62 and the removal positions P1, P2, P3 and P4 of the long side 62a of the substrate 62 are scraped away, and thereby the relay line 201 is severed, and the end parts of the connection lines 202 are removed. Therefore, a depressed part 204 which is traces of scraping away the parts of the substrate 62 is formed in the substrate 62. The depressed part 204 includes first to fifth cutoff parts 204a, 204b, 204c, 204d, and 204e. The first cutoff part 204a is formed in the short side 62c of the substrate 62. The second to fifth cutoff parts 204b, 204c, 204d, and 204e are formed in four positions of the long side 62a of the substrate 62.

Each of the first to fifth cutoff parts 204a, 204b, 204c, 204d, and 204e has a bottom surface 205a and an internal periphery surface 205b, and is opened to the first surface 65a and the outer peripheral surface 65c of the substrate 62. The bottom surface 205a connects to the outer peripheral surface 65c of the substrate 62. Therefore, the first to fifth cutoff parts 204a, 204b, 204c, 204d, and 204e do not pierce through the substrate 62 in the thickness direction, and are positioned in corner parts defined by the first surface 65a and the outer peripheral surface 65c of the substrate 62.

By presence of the first to fifth cutoff parts 204a, 204b, 204c, 204d, and 204e as described above, the pads 72 are electrically separated from one another, although most of the relay line 201 and the connection lines 202 are left on the first surface 65a of the substrate 62. In addition, as illustrated in FIG. 24, a creepage distance between the first conductor pattern 70 on the first surface 65a of the substrate 62 and the thermally radiative sheet 203 deposited on the second surface 65b of the substrate 62 is a value, which is obtained by adding the length of the bottom surface 204a of the depressed part 204. Therefore, the creepage distance is longer than clearance between the first conductor pattern 70 on the first surface 65a of the substrate 62 and the thermally radiative sheet 203 deposited on the second surface 65b by the length of the bottom surface 204a of the recessed part 204. As a result, an insulation distance between the first conductor pattern 70 and the thermally radiative sheet 203 can be sufficiently secured, and the dielectric strength of the substrate 62 is improved.

In the fifth embodiment, three through-holes 206 are formed in the center part of the substrate 62. The through-holes 206 are used for inserting screws, which fix the substrate 62 to a base of an illumination device, and arranged at intervals in the longitudinal direction of the substrate 62.

According to the fifth embodiment as described above, electrical connection between all the pads 72 can be removed, by scraping away the four parts of the long side 62a of the substrate 62 and a part of the short side 62c of the substrate 62. Therefore, the range of the part which is scraped away from the substrate 62 is remarkably reduced, in comparison with the first embodiment and the third embodiment. As a result, the work of removing the second conductor pattern 71 can be easily performed in a short time, and the manufacturing cost of the substrate 62 can be reduced.

Simultaneously, since the range of the part which is scraped away from the substrate 62 is reduced, the quantity of grinding swarf which is generated when the substrate 62 is scraped is reduced. This reduces the possibility that grinding swarf adheres to the pads 72, and prevents deterioration in the workability when the light-emitting elements are affixed to the pads 72.

In the light-emitting devices of the first and the third embodiments, the light-emitting diode chips are mounted on the pads by the chip-on-board method. However, a light-emitting diode package obtained by combining a plurality of light-emitting diode chips may be mounted on the pads by the surface-mount method.

Although the pads are preferably used as a power supply wiring pattern, they are not limited to use as wiring pattern. Specifically, when a reflecting layer is formed on the pads, the electrical-conduction function of the pads is not indispensable, and there are cases where the pads have only to exhibit a function of reflecting light emitted by the light-emitting elements, or a function as heat spreader which spreads heat generated by the light-emitting elements.

In addition, it is not indispensable that the sealing members contain fluorescent material. For example, the red light, green light, or blue light emitted by the light-emitting elements may be directly radiated to the outside of the light-emitting device.

The illumination device using the light-emitting devices is applicable to light-source devices of an electric light bulb type, illumination tools used indoors or outdoors such as spotlights, and displays.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
a substrate;
a plurality of pads arranged on the substrate, each of the pads having electric conductance and a surface on which a reflecting layer formed by electroplating is provided;
a plurality of light-emitting elements which are mounted on the pads; and
a depressed part which is left on the substrate, the depressed part being formed on the substrate by removing a pattern on the substrate, by which the pads are electrically connected,
wherein, the pattern includes a plurality of connection lines which are guided from the pads to a plurality of positions on the substrate; the depressed part includes a plurality of cutoff parts formed in the positions to which the connection lines are guided; the cutoff parts are opened to an edge of the substrate and distant from one another; the substrate includes a first surface on which the pads and the connection lines are arranged, a second surface which is positioned on a side opposite to the first surface, and an outer peripheral surface which connects the first surface with the second surface; and each of the cutoff parts is opened to a corner part of the substrate which is defined by the first surface and the outer peripheral surface, and has a bottom which connects to the outer peripheral surface.

2. The light-emitting device of claim 1, further comprising: a conductor pattern which supplies an electric current to the light-emitting elements, the conductor pattern including the pads and being formed on the substrate.

3. The light-emitting device of claim 1, wherein the depressed part extends along an edge of the substrate in a position distant from the edge of the substrate.

4. The light-emitting device of claim 3, wherein the substrate includes a piercing part through which a fixing tool is inserted, the piercing part is positioned between the edge of the substrate and the depressed part, and the depressed part includes a part which detours around the piercing part in a position corresponding to the piercing part.

5. The light-emitting device of claim 1, wherein the substrate has electric insulating property, and the depressed part has a bottom.

6. The light-emitting device of claim 1, wherein a conductor is deposited on the second surface of the substrate.

7. An illumination device comprising:
a main body; and
a light-emitting device supported by the main body, the light-emitting device including:
a substrate;
a plurality of pads arranged on the substrate, each of the pads having electric conductance and a surface on which a reflecting layer formed by electroplating is provided;
a plurality of light-emitting elements which are mounted on the pads; and
a depressed part which is left on the substrate, the depressed part being formed on the substrate by removing a pattern on the substrate, by which the pads are electrically connected,
wherein the pattern includes a plurality of connection lines which are guided from the pads to a plurality of positions on the substrate; the depressed part includes a plurality of cutoff parts formed in the positions to which the connection lines are guided; the cutoff parts are opened to an edge of the substrate and distant from one another; the substrate includes a first surface on which the pads and the connection lines are arranged, a second surface which is positioned on a side opposite to the first surface, and an outer peripheral surface which connects the first surface with the second surface; and each of the cutoff parts is opened to a corner part of the substrate which is defined by the first surface and the outer peripheral surface, and has a bottom which connects to the outer peripheral surface.

* * * * *